(12) United States Patent
Sato

(10) Patent No.: US 8,653,523 B2
(45) Date of Patent: Feb. 18, 2014

(54) THIN-FILM TRANSISTOR FORMING SUBSTRATE, SEMICONDUCTOR DEVICE, AND ELECTRIC APPARATUS

(75) Inventor: Takashi Sato, Chino (JP)

(73) Assignee: Seiko Epson Corporation, Tokyo (JP)

( * ) Notice: Subject to any disclaimer, the term of this patent is extended or adjusted under 35 U.S.C. 154(b) by 92 days.

(21) Appl. No.: 13/304,766

(22) Filed: Nov. 28, 2011

(65) Prior Publication Data

US 2012/0138940 A1    Jun. 7, 2012

(30) Foreign Application Priority Data

Dec. 1, 2010 (JP) ................................. 2010-268713

(51) Int. Cl.
*H01L 29/786* (2006.01)

(52) U.S. Cl.
USPC .................. 257/59; 257/57; 257/66; 257/72; 257/E29.273

(58) Field of Classification Search
USPC ............................. 257/57, 59, 66, 72, E29.273
See application file for complete search history.

(56) References Cited

U.S. PATENT DOCUMENTS

| | | | |
|---|---|---|---|
| 2001/0005059 A1 | 6/2001 | Koyanagi et al. | |
| 2004/0085618 A1 | 5/2004 | Kawai | |
| 2009/0051046 A1 | 2/2009 | Yamazaki et al. | |
| 2011/0024753 A1* | 2/2011 | Liou | 257/59 |
| 2011/0147747 A1* | 6/2011 | Jeon et al. | 257/59 |

FOREIGN PATENT DOCUMENTS

| | | |
|---|---|---|
| JP | 6-53350 A | 2/1994 |
| JP | 2001-250913 A | 9/2001 |
| JP | 2004-4714 A | 1/2004 |
| JP | 2005-56985 A | 3/2005 |
| JP | 2005-526271 A | 9/2005 |
| JP | 2007-108459 A | 4/2007 |
| JP | 4189887 B | 12/2008 |
| JP | 2009-76882 A | 4/2009 |
| JP | 2010-506400 A | 2/2010 |
| JP | 2010-135584 A | 6/2010 |
| JP | 2010-224391 A | 7/2010 |
| WO | WO-96-41327 A | 12/1996 |
| WO | WO-03-91798 A | 11/2003 |
| WO | WO-2008-042110 A | 4/2008 |

\* cited by examiner

*Primary Examiner* — Whitney T Moore
(74) *Attorney, Agent, or Firm* — ALG Intellectual Property, LLC

(57) ABSTRACT

There is provided a thin-film transistor forming substrate in which at least one of a source electrode, a drain electrode, and a gate electrode, which are constituent elements of a thin film transistor, or a first electrode is included on a face of a substrate main body that is located on any one side in a thickness direction. An embedded wiring that is connected to one of the source electrode, the drain electrode, the gate electrode, and the first electrode is buried inside the substrate main body.

11 Claims, 20 Drawing Sheets

THIN-FILM TRANSISTOR FORMING SUBSTRATE, SEMICONDUCTOR DEVICE, AND ELECTRIC APPARATUS

BACKGROUND

1. Technical Field

The present invention relates to a thin-film transistor forming substrate, a semiconductor device, and an electric apparatus.

2. Related Art

Recently, as a general configuration of flat panel displays (FPDs) such as a liquid crystal display device, an organic EL display device, and an electrophoretic display device, a TFT active matrix is formed on a component substrate that is formed from a rigid glass substrate, and an electro-optical element (a functional element) is interposed between the component substrate and an opposing substrate. In such FPDs, there are problems of the weight, the flexibility, and the like.

As a method of forming TFT elements on a component substrate, as is disclosed in JP-A-2010-135584, a method is used in which a gate electrode, a semiconductor layer, a drain electrode, a source electrode, and the like are sequentially formed on a glass substrate. However, in accordance with the progress in miniaturization of the TFT element, in a case where the TFT element is formed by using such a technique, parasitic capacitance (electrostatic capacitance) formed between multi-layer wirings of the TFT element increases, and the power consumption increases.

In addition, generally, when the TFT element is patterned by using a printing method, the resolution is L/S=about 20/20 μm, which is quite different from the resolution L/S=3/3 μm at the time of photo-etching. The resolution of a color printer is 300 dpi, and the size of one pixel corresponds to 84 μm. Accordingly, it is difficult to realize the resolution at the time of patterning in the above-described printing method.

In addition, although it also relates to the problem of the resolution, even when the resolution is low, and the TFT elements can be formed, a space used for arranging a holding capacitor cannot be secured. Furthermore, even when the space is secured, only a holding capacitor that has low capacitance can be formed. Accordingly, in the case of an electrophoretic display device, there is a problem in that a time required for rewriting an image increases, or the power consumption increases, and in the case of a liquid crystal device, there is a problem in that flicker increases or burn-in increases.

Furthermore, in a high-precision display, the parasitic capacitance of the TFT element increases, and the resistance between wirings increases, whereby the time constant increases. Accordingly, there are problems of a decrease in the image rewriting speed, a decrease in the contrast, an increase in flicker, and the like. In a case where the TFT elements are formed on a substrate of an A4 size with the resolution of 300 dpi, about 3000×2.2 million pixels are formed, the duty ratio is 1/3000, and the number of pixels is about three times that of a general high-definition television set.

In JP-T-2010-506400, a method of manufacturing an electronic device is disclosed in which TFT elements are formed on a multi-layer substrate, and the TFT elements are formed by using wirings in the multi-layer substrate. In addition, a case is disclosed in which such an electronic device is formed as a backplane of a display device.

In JP-A-2004-004714, a configuration is disclosed in which thin film transistors are arranged on a rear face of a circuit substrate that is disposed on a side opposite to the side of an electrophoretic dispersion solution layer, and the chemical deterioration of the transistors is prevented by arranging the electrophoretic dispersion solution layer and the thin film transistors with the circuit substrate being interposed therebetween.

However, in JP-T-2010-506400, since the multi-layer substrate and a thin-film component forming layer formed from TFT elements and the like on the multi-layer substrate are formed in completely separated processes, the number of processes increases, whereby the manufacturing process is complicated. In addition, in order to allow the TFT element to have a switching function or a display image driving function, a holding capacitor needs to be formed. Accordingly, a process for forming the holding capacitors on the TFT layer is necessary, and spaces used for forming the holding capacitors are necessary, whereby it is difficult to implement high precision. In addition, generally, since the multi-layer substrate is formed from an opaque substrate, it is difficult to repair, leading to a decrease in the yield ratio, and the like so as to cause various problems.

In addition, in JP-A-2004-004714, since the thin film transistors are configured on the rear face of the circuit substrate, the thin film transistors may be easily affected by the degree of moisture or the like so as to cause a malfunction. Furthermore, there is a problem in that a blemish or the like may be included at the time of manufacturing an electro-optical device.

SUMMARY

An advantage of the invention is that it provides a thin-film transistor forming substrate, a semiconductor device, and an electric apparatus capable of realizing high precision of thin film transistors by building at least one of the constituent elements of each TFT element inside a multi-layer substrate.

According to a first aspect of the invention, there is provided a thin-film transistor forming substrate in which at least one of a source electrode, a drain electrode, and a gate electrode, which are constituent elements of a thin film transistor, or a first electrode is included on a face of a substrate main body that is located on any one side in a thickness direction. An embedded wiring that is connected to one of the source electrode, the drain electrode, the gate electrode, and the first electrode is buried inside the substrate main body.

According to the above-described thin-film transistor forming substrate, since the embedded wiring to which at least the constituent element of the thin film transistor disposed on the surface of the substrate main body is partially connected is buried inside the substrate main body, high precision of the thin film transistor can be realized.

In the above-described thin-film transistor forming substrate, the embedded wiring may be configured as one of a scanning line, a data line, a holding capacitor line, a holding capacitor, a signal line, and a power supply line.

In such a case, by burying the wiring that is increased in accordance with the implementation of high precision of the thin film transistors inside the substrate main body, spaces used for forming the thin film transistors and the embedded wirings can be sufficiently secured. Accordingly, the problem of the wiring forming space on the substrate can be resolved, and the high precision of the thin film transistors can be achieved.

In addition, it may be configured such that the substrate main body is formed by laminating a plurality of base members, and the embedded wiring is buried inside one of the plurality of base members, or a plurality of the embedded wirings is buried in the base members that are different from each other.

In such a case, by configuring the substrate as a multi-layer substrate structure in which a plurality of base members is laminated, such forming spaces can be secured without being limited to the number of the embedded wirings, and a plurality of the embedded wirings can be maintained well.

In addition, the substrate main body may be configured so as to have flexibility or stretchability.

In such a case, by disposing the above-described embedded wiring inside the substrate main body, the substrate main body can be allowed to be bent so as to be used in the state in which the reliability of the connection with the thin film transistor is high.

In addition, an electronic component may be configured so as to be buried inside the substrate main body.

In such a case, since the electronic component used for driving the thin film transistor is buried inside the substrate main body, the space for forming the electronic component can be sufficiently secured. In addition, even in a case where the substrate is used in a bent state, the electronic component is maintained well inside the main body, and accordingly, high reliability of the connection between the electronic component and the embedded wiring can be acquired.

In addition, an arrangement space of a plurality of the electronic components may be configured to be equal to or greater than a length of one side of the electronic component and be preferably equal to or greater than three times the length of one side.

In such a case, the curvature of the electronic component built-in substrate can be prevented from being deteriorated by the electronic component. Accordingly, the thin-film transistor forming substrate can be used in a gently bent state, for example, like a desk pad as stationery, whereby the versatility thereof is improved. In addition by configuring the arrangement space to be equal to or more than three times the length of one side of each electronic component, the flexibility can be improved further.

In addition, the electronic component may be configured so as to include at least one or more types of an IC, a capacitor, a resistor, and an inductor.

Furthermore, at least a part of one of the source electrode, the drain electrode, and the gate electrode or the first electrode may be configured to be buried inside the substrate main body so as to be connected to the embedded wiring.

In such a case, since at least a part of the electrode is buried inside the substrate, even when the substrate is used in a bent state, the connection states between each electrode and another electrode, a wiring, or the like connected thereto can be good.

In addition, a line width of the embedded wiring may be configured so as to be set to a size smaller than a size of a thickness of an insulating member arranged between the embedded wirings.

In such a case, the parasitic capacitance formed between wirings can be decreased. Therefore, the occurrence of crosstalk or display unevenness is prevented.

According to a second aspect of the invention, there is provided a semiconductor device including: a substrate that is formed from the above-described thin-film transistor forming substrate; a thin film transistor that includes a semiconductor layer, a gate electrode, a drain electrode, and a source electrode that are configured so as to include a part of the constituent elements of the thin film transistor formed on the substrate; a first electrode that is connected to the drain electrode; and an embedded wiring that is embedded inside the substrate and connected to the thin film transistor.

According to the above-described semiconductor device, since the embedded wiring to which at least the constituent element of the thin film transistor disposed on the surface of the substrate main body is partially connected is buried inside the substrate main body, high precision of the thin film transistor can be realized. In addition, since the embedded wiring is maintained inside the main substrate, disconnection or the like is prevented, and the connection state with the thin film transistor can be maintained well, whereby a semiconductor device having high reliability can be acquired.

In addition, in the above-described semiconductor device, the source electrode, the drain electrode, and the first electrode may be configured to be formed in a same layer.

In such a case, the source electrode, the drain electrode, and the first electrode can be formed in the same process.

In addition, in the thin film transistor, at least parts of the semiconductor layer, the source electrode, and the drain electrode may be pinched by one pair of the gate electrodes so as to form a double gate structure.

In such a case, by employing the double gate structure, the high frequency characteristics of the thin film transistor can be improved.

According to a third aspect of the invention, there is provided an electric apparatus including: a component substrate that is formed from the above-described semiconductor device; an opposing substrate that is arranged so as to face the component substrate; and a functional element that is arranged between the component substrate and the opposing substrate. The opposing substrate includes an opposing electrode on a side of the functional element, the component substrate includes a plurality of first electrodes on a face located on the side of the functional element, and a voltage used for driving the functional element is supplied between the plurality of first electrodes and the opposing electrode by the electronic component.

According to the above-described electric apparatus, since the component substrate that is formed from the semiconductor device including high-precision thin film transistors having a small variation of the characteristics is included, an electric apparatus having high reliability can be acquired.

In addition, in the above-described electric apparatus, the component substrate and the opposing substrate may be configured to have flexibility.

In such a case, the electric apparatus can be used in a bent state, and the electric apparatus that is thin and light and has high robustness can be acquired. In addition, even in a case where the electric apparatus is used in the bent state, the embedded wiring is maintained inside the substrate main body. Accordingly, disconnection of wirings and the like are prevented, and the connection state with the thin film transistor can be also maintained well, whereby a semiconductor device having high reliability can be acquired.

In addition, the component substrate and the opposing substrate may be configured to have stretchability.

In such a case, the electric apparatus can be used in a bent state, and the electric apparatus that is thin and light and has high robustness can be acquired. In addition, even in a case where the electric apparatus is used in the bent state, the embedded wiring is maintained inside the substrate main body. Accordingly, disconnection of wirings and the like are prevented, and the connection state with the thin film transistor can be also maintained well, whereby a semiconductor device having high reliability can be acquired.

In addition, the functional element may be configured as a display element that has a display unit in which a plurality of pixels is arranged.

In such a case, the display element that is thin and lightweight like a paper sheet and can be used in the bent state can be acquired, whereby the versatility thereof is improved.

In addition, it may be configured such that one pair of electrodes that are formed over the plurality of pixels and a holding capacitor line that is arranged between the one pair of electrodes through an insulating member are further included, and holding capacitors are formed between the one pair of electrodes and the holding capacitor line.

In such a case, a large area for forming the holding capacitor can be acquired. In addition, by burying the holding capacitor inside the substrate main body, the area used for forming the thin film transistors on the component substrate can be sufficiently acquired, whereby high precision can be realized.

In addition, gate insulating films arranged between the gate electrode, the drain electrode, and the source electrode and protection layers that cover the gate insulating films may be configured to be selectively disposed for each pixel.

In such a case, the cost of the materials of the gate insulating films and the protection layer can be reduced.

In addition, a moisture-resistant layer may be configured to be disposed on one face of at least one of a plurality of base members configuring the substrate in a thickness direction.

In such a case, the moisture-resistance of the functional element can be improved, whereby an increase in the power consumption in accordance with an increase in the leakage current can be prevented.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the accompanying drawings. In each diagram used for the description presented below, in order to allow each member to have a recognizable size, the scale of each member is appropriately changed.

First Embodiment

Figure 1A:
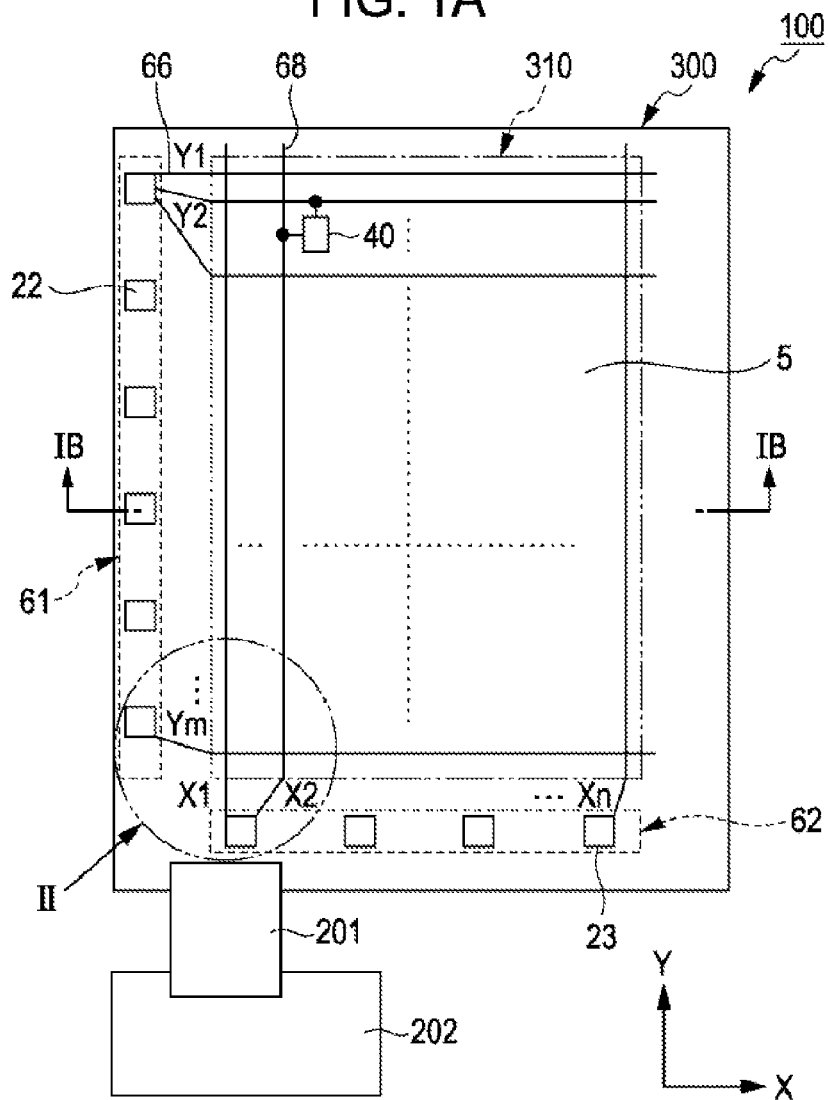
FIG. 1A is a plan view showing a schematic configuration of a component substrate, which configures an electric apparatus, according to a first embodiment.
Figure 1B:
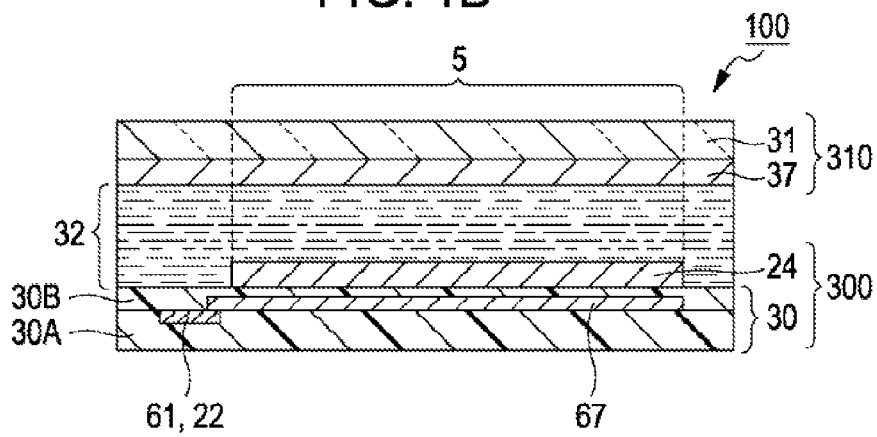
FIG. 1B is a cross-sectional view taken along line IB-IB shown in FIG. 1A.

FIG. 1A is a plan view showing a schematic configuration of a component substrate, which configures an electric apparatus, according to a first embodiment, and FIG. 1B is a cross-sectional view showing a schematic configuration of the electric apparatus.

As shown in FIGS. 1A and 1B, in an electro-optical device (electric apparatus) 100, an electro-optical element (functional element) 32 is interposed between a component substrate 300 and an opposing substrate 310 that respectively have flexibility.

The component substrate (semiconductor device) 300 is configured by a first substrate (thin-film transistor forming substrate) 30 that is formed from a plurality of laminated base members and a driving circuit layer 24. The first substrate 30 is configured so as to include a wiring layer 67 that has scanning lines, data lines, holding capacitors, and the like, a scanning line driving circuit 61, and a data line driving circuit 62. In addition, on the uppermost layer, at least one of a source electrode 41c, a drain electrode 41d, a gate electrode 41e, which configure a control transistor TRc, and a pixel electrode (first electrode) 35 is disposed. In many cases, a part thereof is buried in the first substrate 30, and the first substrate 30 is formed so as to include such electrodes. The driving circuit layer 24 includes the pixel electrodes (first electrodes) 35, the control transistors (thin film transistors) TRc, and the like.

On the other hand, the opposing substrate 310 is configured so as to include the opposing electrodes 37 and a second substrate 31. The planar size of the component substrate 300 is larger than that of the opposing substrate 310.

In an area at which the component substrate 300 and the opposing substrate 310 overlap each other, a plurality of scanning lines (embedded wirings) 66 and a plurality of data lines (embedded wirings) 68 are formed. In addition, a display unit 5 is formed in which a plurality of pixels 40 is arranged in a matrix pattern in correspondence with positions of the intersections thereof. On the periphery of the display unit 5, that is, inside the first substrate 30 of the component substrate 300 that extends to the outer side of the opposing substrate 310, the scanning line driving circuit 61 that is formed by a plurality of electronic components 22 and the data line driving circuit 62 that is formed by a plurality of electronic components 23 are buried.

The scanning line driving circuit 61 is connected to the pixels 40 through m scanning lines 66 (Y1, Y2, . . . , Ym), under the control of each electronic component 22, sequentially selects the first to m-th scanning lines 66, and supplies a respective selection signal that defines the On-timing of each control transistor TRc (see FIG. 2) disposed in the pixels 40 through the selected scanning line 66.

The data line driving circuit 62 is connected to the pixels 40 through n data lines 68 (X1, X2, . . . , Xn) and, under the control of each electronic component 23, supplies an image signal that defines pixel data corresponding to each pixel 40 to the pixel 40.

Here, the degree to which the electro-optical device 100 can be bent relates to the degree of flexibility of the material of the component substrate 300 and the size and the arrangement space of a plurality of electronic components (IC) 22 and 23 buried inside the first substrate 30. Here, the arrangement space of the electronic components (IC) 22 and 23 that are adjacent to each other in the direction X and the direction Y shown in FIG. 1A is set to be equal to or more than five times the length of one side of each one of the electronic components (IC) 22 and 23. More specifically, since the length of one side of each one of the electronic components (IC) 22 and 23 is 2 mm, a distance between the electronic components (IC) 22 and 23 adjacent to each other is equal to or more than 10 mm.

By arranging the plurality of the electronic components (IC) 22 and 23 at the space, the degree of flexibility that is almost the same as the original degree of flexibility of the composition material (polyimide material) of the first substrate 30 can be implemented in the component substrate 300. In order to implement the degree of flexibility that is the same as that of the material of the first substrate 30 in the component substrate 300, it is necessary to set the arrangement space between the electronic components (IC) 22 and 23 to be at least equal to or more than three times the length of one side of the electronic components (IC) 22 and 23.

In addition, as a reference, by setting the arrangement space between the electronic components (IC) 22 and 23 to be equal to or more than the length of one side of the electronic components (IC) 22 and 23, the component substrate 300 can be gently bent, for example, like a desk pad as stationery. In this state, although the electronic components (IC) 22 and 23 are not bent, and a small radius of curvature cannot be given, flexibility can be implemented in the component substrate 300.

Furthermore, the length of one side of the electronic components (IC) 22 and 23 is equal to or less than 5 mm, is more preferably equal to or less than 3 mm, and is further more preferably equal to or less than 1 mm. In a case where small electronic components (IC) 22 and 23 are used, they are difficult to break when the component substrate 300 is bent, and the robustness thereof can be increased. In addition, the stress applied to the electronic components (IC) 22 and 23 when the component substrate 300 is bent decreases. Accordingly, the electronic components (IC) 22 and 23 are prevented from being broken, and a state of bonding the first substrate 30 and the electronic components (IC) 22 and 23 together and a state of connecting terminals (not shown in the figure) of the electronic components (IC) 22 and 23 and connection wirings that connect the connection terminals can be secured.

Here, the built-in positions of the electronic components (IC) 22 and 23 inside the component substrate 300, that is, the positions of the electronic components (IC) 22 and 23 in the thickness direction of the component substrate 300 are not particularly defined. All the electronic components (IC) 22 and 23 may be arranged on the side of a base member 30A configuring the first substrate 30, all the electronic components (IC) 22 and 23 may be arranged on the side of a base member 30B, or a plurality of the electronic components (IC) 22 and 23 may be respectively arranged in the base members 30A and 30B. In addition, the number of base members that configure the first substrate 30 is not limited to two, and all the electronic components (IC) 22 and 23 may be disposed in base members different from each other.

In addition, the electronic components 22 and 23 may be buried inside the first substrate 30 located inside the display unit 5 instead of the outer side of the display unit 5. By employing such a configuration, an area other than the display unit 5 can be decreased.

Furthermore, it is known that, by decreasing the thickness of the electronic components (IC) 22 and 23 to be equal to or less than 20 μm through a grinding process or the like, the degree of flexibility that is the same as that of the component substrate 300 is implemented in the electronic components (IC) 22 and 23. However, even in such a case, since the electronic components 22 and 23 have elasticity, the connection reliability and the like can be improved by defining the positions as described above.

In addition, although the electronic components (IC) 22 and 23 for driving display elements have been described as an example, the same applies to rigid electronic components such as various ICs (other electronic components (IC) 22 and 23), capacitors, resistors, inductors, or switches.

As shown in FIG. 1A, an external device 202 is connected through a connection wiring substrate 201 to the component substrate 300 according to this embodiment. In this connection wiring substrate 201, external circuits used for operating the scanning line driving circuit 61 and the data line driving circuit 62 and the like are mounted. As the external device 202, a power supply or the like is used.

Figure 2:
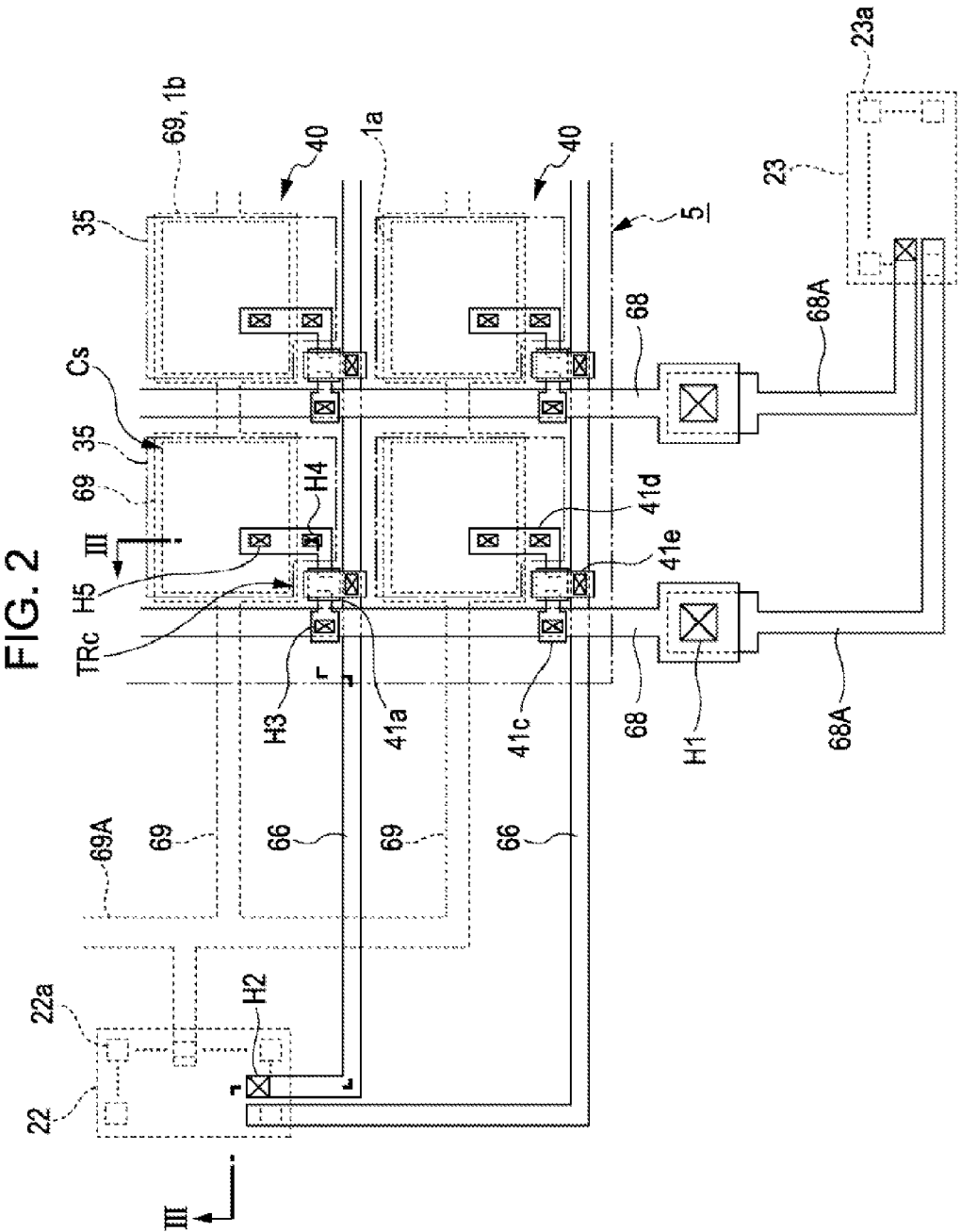
FIG. 2 is an enlarged plan view of an area II shown in FIG. 1A.
Figure 3:
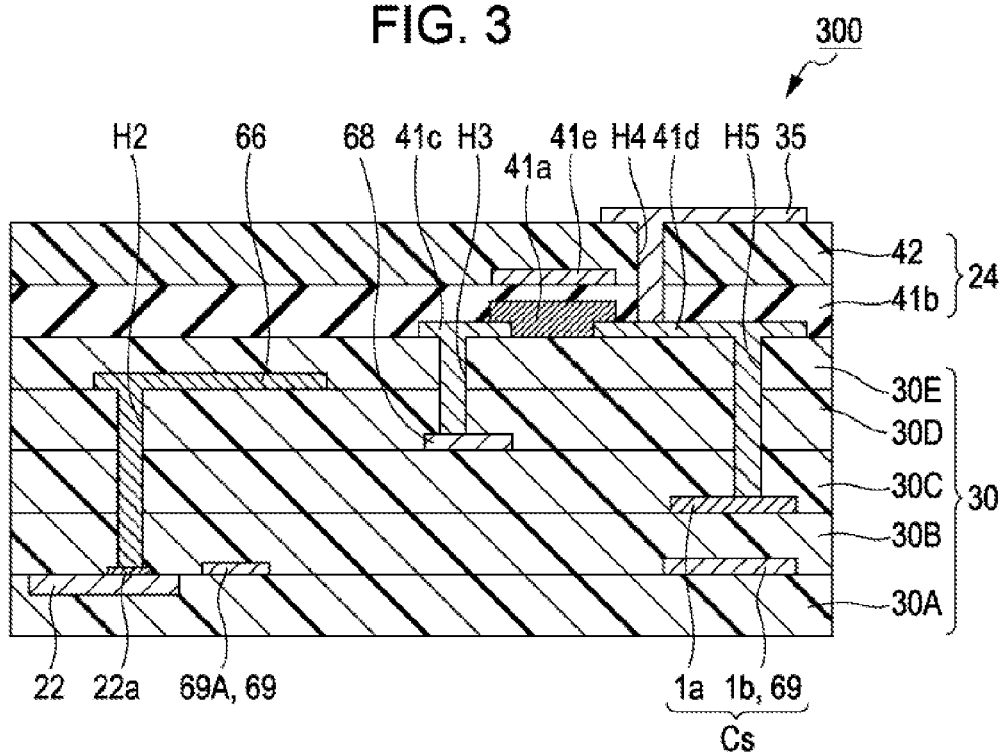
FIG. 3 is a cross-sectional view taken along line III-III shown in FIG. 2.

FIG. 2 is an enlarged plan view of an area II shown in FIG. 1A. FIG. 3 is a cross-sectional view taken along line III-III shown in FIG. 2.

As shown in FIGS. 2 and 3, a plurality of the pixels 40 is arranged in the display unit 5, and the control transistor TRc, a pixel electrode 35, and the like are disposed for each pixel 40.

The control transistor TRc includes: a semiconductor layer 41a, which has a source region and a drain region, having an approximately rectangular shape in the plan view; a source electrode 41c extending from the data line 68; a drain electrode 41d connecting the semiconductor layer 41a and the pixel electrode 35; and a gate electrode 41e extending from the scanning line 66. In an area in which the pixel electrode 35 and a holding capacitor line 69 overlap each other, a holding capacitor Cs is formed. One holding capacitor electrode 1a that configures the holding capacitor Cs is connected to the drain electrode 41d, and the other holding capacitor electrode 1b is connected to the holding capacitor line 69.

The control transistor TRc is a switching device that controls the input of an image signal to the pixel 40, and an image signal voltage supplied through the control transistor TRc is maintained in the holding capacitor Cs. The electro-optical element 32 is driven in accordance with a current corresponding to the voltage of the holding capacitor Cs. Here, the control transistor TRc is an N-MOS (Negative Metal Oxide Semiconductor) transistor.

In addition, the transistor that configures the pixel 40 may be replaced by a switching device of a different type that has the same function as that of the transistor. For example, a P-MOS transistor may be used instead of the N-MOS transistor.

On the periphery (non-display region) of the display unit 5, the scanning line driving circuit 61 and the data line driving circuit 62 are disposed. A plurality of the scanning lines 66 extending from the display unit 5 is connected to the electronic components 22 that configure the scanning line driving circuit 61. In addition, one end side of each one of a plurality of the holding capacitor lines 69 extending from the display unit 5 is connected together through a holding capacitor line 69A, and the holding capacitor line 69 is connected to the electronic component 22 through the holding capacitor connection line 69A. Furthermore, each one of a plurality of the data lines 68 extending from the display unit 5 is connected to the electronic component 23 through a data line connection wiring 68A that is connected to one end side thereof. Here, two or more scanning lines 66 or two or more data lines 68 are connected to one electronic component 22 or 23.

As shown in FIG. 3, the component substrate 300 according to this embodiment is configured by the first substrate 30 including a wiring layer 67 therein and a driving circuit layer 24 formed thereon and has flexibility together with the opposing substrate 310. Accordingly, the component substrate 300 is appropriate for a use that requires flexibility such as electronic paper or an artificial skin.

In the opposing substrate 310, an opposing electrode 37 that is formed from ITO having a thickness of 0.1 µm is formed on a transparent second substrate 31 formed from PET having a thickness of 100 µm. Since the electro-optical element 32 is observed through the second substrate 31, the second substrate 31 is transparent.

The first substrate 30 is configured by five base members (insulating members) 30A to 30E that are laminated, wirings and circuits disposed inside thereof, and a source electrode 41c and a drain electrode 41d that are disposed on the base member 30E of the uppermost layer. Parts of the source electrode 41c and the drain electrode 41d are buried in base members 30D and 30E. The wirings buried inside thereof are the scanning lines (embedded wirings) 66, the data lines (embedded wirings) 68, the holding capacitors (embedded wirings) Cs, the holding capacitor lines (embedded wirings) 69, the scanning line driving circuit 61, and the data line driving circuit 62. In addition, electronic components such as a signal line, a power supply line, a connection line between wirings or electrodes, a capacitor, and a resistor may be buried therein. The base members 30A to 30E are flexible substrates that are formed from polyimide having a thickness of 50 µm. Since a user visually recognizes an image from the opposing substrate 310 side, the first substrate 30 may be a non-transparent substrate.

More specifically, in the base member 30A, a plurality of electronic components 22 that configure the scanning line driving circuit 61 and a plurality of electronic components 23 (electronic components 23: not shown in FIG. 3) that configure the data line driving circuit 62 are buried inside a concave portion that is formed on the surface side thereof. Here, the base member located on the periphery of the electronic component (IC) 22 is non-transparent. Accordingly, an abnormal operation of the electronic component (IC) 22 due to the leakage of light does not occur.

On the base member 30A, the holding capacitor line 69 that becomes one electrode (embedded wiring) 1b of the holding capacitor Cs and the holding capacitor connection line (embedded wiring) 69A that connects the holding capacitor line 69 and the electronic component 22 together are formed and are configured by Cu wirings having a thickness of 3 µm. On the surface of the base member 30B that is laminated on the base member 30A so as to cover the holding capacitor line 69 and the holding capacitor connection line 69A, the other electrode (embedded wiring) 1a of the holding capacitor Cs is disposed for each pixel 40.

On the surface of the base member 30C laminated on the base member 30B, a plurality of the data lines 68 is formed, and the data lines 68 are connected to data line connection wirings 68A (FIG. 2) disposed on the surface of the base member 30A through contact holes H1 (FIG. 2). Here, the contact hole H1 is formed by burying a part of the data line 68 inside the base members 30B and 30C. Accordingly, the plurality of the data lines 68 is respectively connected to the electronic components 23 (external connection terminals 23a) that configure the data line driving circuit 62.

On the surface of the base member 30D laminated on the base member 30C, a plurality of the scanning lines 66 is formed. Each scanning line 66 is connected to the electronic component 22 that configures the scanning line driving circuit 61 arranged inside the base member 30A through a contact hole H2 passing through the base members 30B, 30C, and 30D. The contact hole H2 is formed at a position overlapping the external connection terminal 22a of the electronic component 22. In addition, the base member 30E is laminated on the base member 30D so as to cover the scanning line 66. As above, inside the first substrate 30 that configures the component substrate 300 according to this embodiment, the wiring layer 67 that includes the scanning line 66, the data line 68, the holding capacitor Cs, the holding capacitor line 69, the scanning line driving circuit 61, and the data line driving circuit 62 is buried.

Here, the scanning line 66, the data line 68, one pair of the holding capacitor electrodes (embedded wirings) 1a and 1b that configure the holding capacitor Cs, and the holding capacitor line 69 are formed from Cu wirings having a thickness of 5 µm.

The driving circuit layer 24 used for driving pixels that is formed on the surface of the first substrate 30 (the base member 30E) includes the control transistor TRc and the pixel electrode 35 for each pixel 40. The source electrode 41c of the control transistor TRc is connected to the data line 68 through a contact hole H3 passing through the base members 30D and 30E, and the drain electrode 41d thereof is connected to the holding capacitor electrode 1a of the holding capacitor Cs through a contact hole H5 that passes through the base members 30C, 30D, and 30E. The source electrode 41c and the drain electrode 41d are formed from Au wirings or Cu wirings that have a thickness of 0.2 μm.

In addition, the semiconductor layer 41a formed from pentacene having a thickness of 50 nm is disposed so as to be seated on the peripheral edge portion of the source electrode 41c and the drain electrode 41d disposed for each pixel 40. On the entire surface of the base member 30E, a gate insulating film 41b formed from polyimide having a thickness of 0.5 μm is disposed so as to cover the source electrode 41c, the drain electrode 41d, and the semiconductor layer 41a.

On the surface of the gate insulating film 41b, the gate electrode 41e that configures the control transistor TRc is disposed at a position overlapping the semiconductor layer 41a. This gate electrode 41e is formed from a Cu paste having a thickness of 300 nm.

In addition, on the entire surface of the gate insulating film 41b, a protection layer 42 formed from acryl having a thickness of 1 μm is disposed so as to cover the gate electrode 41e, and the pixel electrode 35 formed from a carbon paste is formed on the surface thereof for each pixel 40. This pixel electrode 35 is connected to the drain electrode 41d located on the lower side through the contact hole H4 passing through the protection layer 42 and the gate insulating film 41b in the thickness direction thereof. As above, the component substrate 300 according to this embodiment is configured. The film thickness of the pixel electrode 35 formed on the protection layer 42 is 0.2 μm.

Here, the area of the display unit 5 at which the driving circuit layer 24 is disposed is not limited to that shown in FIG. 2. In FIG. 2, although the wiring layer 67 located inside the first substrate 30 and the driving circuit layer 24 located on the first substrate 30 are shown in the figure as being aligned for easy understanding of the configuration thereof, the wiring layer 67 may be actually buried inside the first substrate 30 as being arranged so as to overlap the driving circuit layer 24 in the plan view.

Accordingly, the control transistor TRc can be formed on the first substrate 30 in a relatively large area. This means that a component substrate 300 that includes control transistors TRc with higher precision can be configured by using the same pattern rule. More specifically, the control transistors TRc are created on various wirings and the holding capacitor Cs that are buried inside the first substrate 30 in the plan view, thereby realizing high precision. This is especially effective in a case where a coating method is used such as a case of an organic TFT or an oxide TFT.

In addition, a component that occupies a large formation area inside the pixel area is the holding capacitor Cs. Accordingly, it is effective for implementing high precision of the control transistors TRc to bury the holding capacitors Cs inside the first substrate 30.

Here, the above-described control transistor TRc is created by repeating coating and burning of the material. Generally, a silicon-based TFT or an oxide TFT is created by using a plasma CVD method or a sputtering method. In such a method, the substrate is strongly charged by the generation of plasma. In this embodiment, since the control transistor TRc is created on the first substrate 30 in which a plurality of electronic components 22 and 23 are buried, the first substrate 30 is exposed to plasma, whereby the electronic components 22 and 23 are electrostatically damaged. For example, static electricity penetrates inside through the external connection terminals 22a and 23a of the electronic components 22 and 23. Accordingly, it is preferable that the TFTs are created by using a technique that does not use plasma.

As one of such techniques, there is a method of coating the material by using a printing method of an ink jet method, a method using vapor deposition or a sol-gel method, or the like.

In addition, generally, it is known that the semiconductor material of an organic TFT, differently from a transparent oxide TFT, absorbs light. When light is absorbed, a light leakage current is generated, or an organic carrier is accepted in the gate insulating film 41b, whereby the threshold value Vth is shifted. Accordingly, it is preferable that the first substrate 30 is a non-transparent substrate.

In this embodiment, the scanning lines 66, the data lines 68, the holding capacitor lines 69, and the holding capacitors Cs and the source electrode 41c and the drain electrode 41d of the control transistor TRc arranged on the surface of the first substrate 30 are formed in the process of generating the first substrate 30. Generally, various wirings and electrodes formed inside the first substrate 30 and the surface thereof are formed by using a photo-etching method. Accordingly, the source electrode 41c and the drain electrode 41d that have small variations in the size are formed. In a TFT having a top-gate and bottom-contact structure, the source electrode 41c and the drain electrode 41d determine a channel length. Accordingly, a TFT having small variations in the TFT characteristics (on-current, off-current, and the like) can be created by using the photo-etching method.

Generally, developments have progressed for forming a TFT such as an organic TFT or an oxide TFT that is formed by using a coating method, particularly, by not using a photo-etching method. The reason for this is that the manufacturing cost increases when the photo-etching method is used. However, a distance between the source electrode 41c and the drain electrode 41d is a channel length, which directly affects the TFT characteristics thereof. The variation in the size thereof causes variations in the TFT characteristics so as to cause non-uniformity of a display. Accordingly, it is necessary to decrease the variation in the size. Therefore, in a case where the source electrode 41c and the drain electrode 41d are configured as parts of the first substrate 30 and are formed by using the photo-etching method, low cost and improvement of the quality accompanied by the improvement of the TFT characteristics can be achieved, which is a great advantage. Particularly, the advantage is enormous for an organic TFT or an oxide TFT that is created by using a coating method.

In addition, by burying parts of the source electrode 41c and the drain electrode 41d in the first substrate 30, an electro-optical device having a reliable connection and high robustness can be realized.

However, in principle, the TFT can be created by using plasma, and an amorphous silicon TFT, a low-temperature polysilicon TFT, or an oxide TFT such as a-IGZO may be created.

In addition, in this embodiment, although an example of the top-gate and bottom-contact is illustrated as the TFT structure, other configurations may be employed. For example, a bottom-gate and bottom-contact, a top-gate and top contact, or a bottom-gate and top-contact may be employed.

In addition, in FIGS. 2 and 3, the scanning line 66, the data line 68, the holding capacitor line 69, and the holding capacitor electrodes 1a and 1b of the holding capacitor Cs are appropriately disposed on different base members (areas). Generally, a multi-layer substrate is opaque, and the configuration thereof is complicated, and it is difficult to repair even when the occurrence of a defect is determined in a test. Accordingly, a configuration is preferable which can be initially formed with a high yield ratio. Here, in order to prevent formation of short circuits between various wirings and electrodes, the wirings and the electrodes are arranged in different layers. In particular, since the formation areas of the holding capacitor line 69 (the holding capacitor electrode 1b) and the holding capacitor electrode 1b are large, a defect due to the formation of a short circuit may easily occur therein. Therefore, it is preferable that, particularly, the holding capacitor line 69 is formed on a layer different from that of the scanning line 66 or the data line 68.

Furthermore, as will be described later, in a case where power supply wirings are formed inside the display region as in a case where a memory function such as an SRAM is included, it is preferable the power supply wirings are formed in a different layer (on a different base member).

In addition, in order to prevent the disconnection of various wirings, a dual wiring may be employed. The dual wiring described here is to arrange one wiring to be divided into two in the same layer. Thus, even when one side is disconnected, the wiring is not disconnected. Here, by forming one wiring to be thick, the disconnection can be prevented. However, in such a case, the parasitic capacitance of the wiring increases, and accordingly, the power consumption increases. Therefore, it is preferable to wire one wiring so as to be divided into a plurality of wirings.

As shown in FIG. 3, a plurality of the electronic components 22 and 23 that configure the scanning line driving circuit 61 and the data line driving circuit 62 are buried inside the first substrate 30. In addition, the electronic components 22 and 23 are arranged between the base member 30A and the base member 30B that are bonded together in a fixed manner, and accordingly, the reliability of the connection with the scanning line 66 and the holding capacitor connection line 69A (the holding capacitor line 69: FIG. 2) that are connected to the electronic components 22 and 23 is high. The component substrate 300 (flexible substrate) according to this embodiment is used in a folded state (bent state), and the connection reliability is particularly important. In a case where the electronic components 22 and 23 are connected to the front face or the rear face of the first substrate 30 (the component substrate 300) using an ACF or the like, when the component substrate 300 is folded (bent), a connection defect may easily occur. Accordingly, by burying the electronic components 22 and 23 in the middle of the first substrate 30, the component substrate 300 of which the robustness is appropriate for a use in a bent state (folded state) can be acquired.

Figure 4:
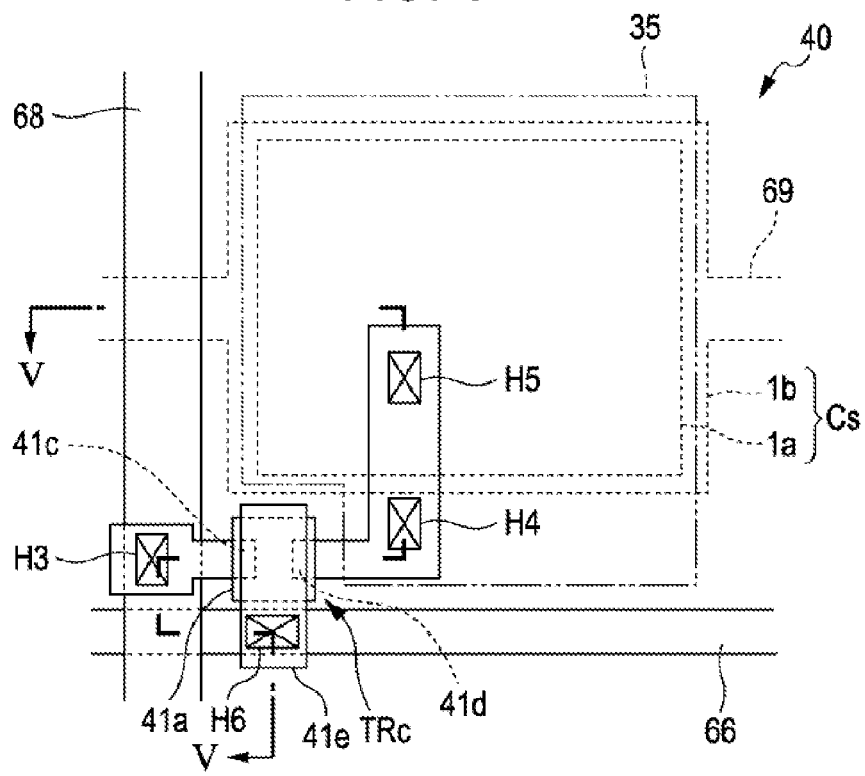
FIG. 4 is an enlarged plan view showing a schematic configuration of one pixel.
Figure 5:
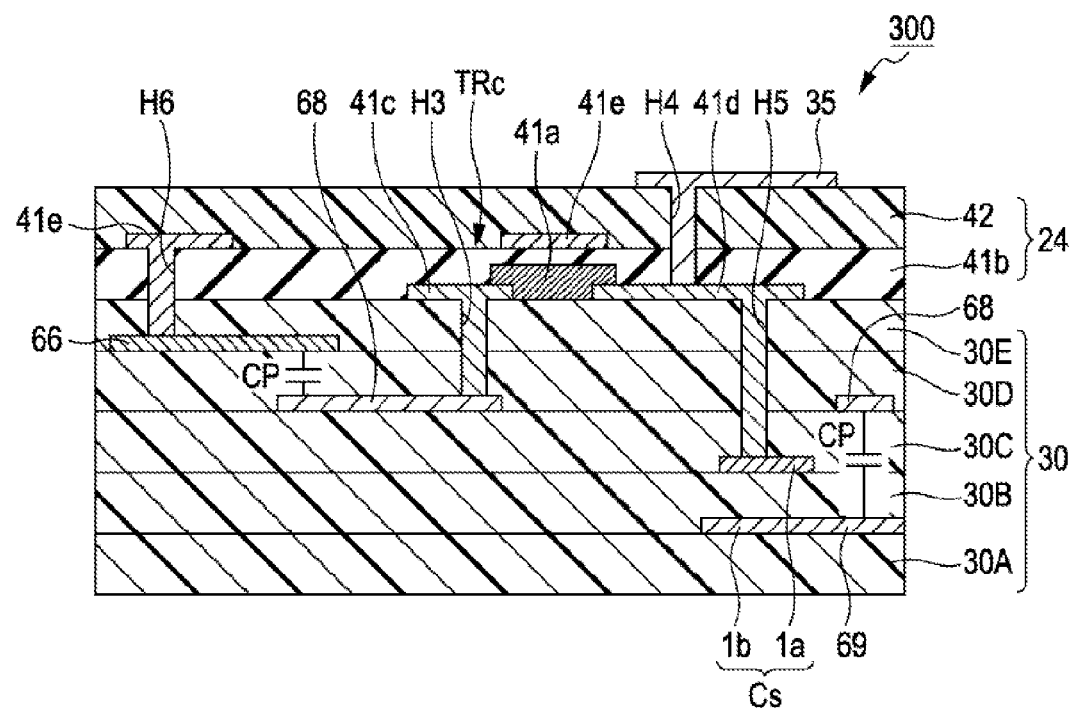
FIG. 5 is a cross-sectional view taken along line V-V shown in FIG. 4.

FIG. 4 is an enlarged plan view showing a schematic configuration of one pixel. FIG. 5 is a cross-sectional view taken along line V-V shown in FIG. 4.

Here, the parasitic capacitance will be described.

Generally, in the driving circuit layer that is formed on a glass substrate, the thickness of the gate insulating film 41b is about 0.5 μm, and the wiring width of the scanning line 66, the data line 68, and the holding capacitor line 69 is about 3 μm. In the representative bottom-gate and top-contact structure, the gate insulating film 41b also serves as an interlayer insulating among the data line 68, the scanning line 66, and the holding capacitor line 69 and is formed as a thin insulating film. In addition, since the wiring width of the scanning line 66, the data line 68, and the holding capacitor line 69 is larger than the size of the film thickness of the gate insulating film 41b, high parasitic capacitance is formed between the wirings. It is known that crosstalk or display unevenness occurs due to the parasitic capacitance. Particularly, when the rounding of the waveform occurs in the scanning line 66, the data line 68, and the holding capacitor line 69, a display is directly influenced.

In contrast to this, in the flexible component substrate 300 according to this embodiment shown in FIGS. 4 and 5, the thickness of the interlayer insulating film is the thickness of each one of the base members 30A to 30E of the first substrate 30, and accordingly, the interlayer insulating film has a thickness having one order of magnitude higher than that of the case of the glass substrate. Generally, the thickness of each base member is 2 to 200 μm. As shown in FIG. 5, parasitic capacitance (Cp) is respectively generated in an area in which the scanning line 66 and the data line 68 intersects (overlaps) each other and an area in which the data line 68 and the holding capacitor line 69 intersects (overlaps) each other. Although low parasitic capacitance (Cp) can be realized based on only the film thickness of the substrate, by additionally setting the line width of various wirings buried in the first substrate 30 so as to satisfy the relationship of "the various wiring widths (the scanning line 66, the data line 68, and the holding capacitor line 69)<the thickness of the first substrate 30 configuring the parasitic capacitance", the parasitic capacitance generated between the wirings can be decreased more than that of the configuration using the glass substrate.

Figure 6:
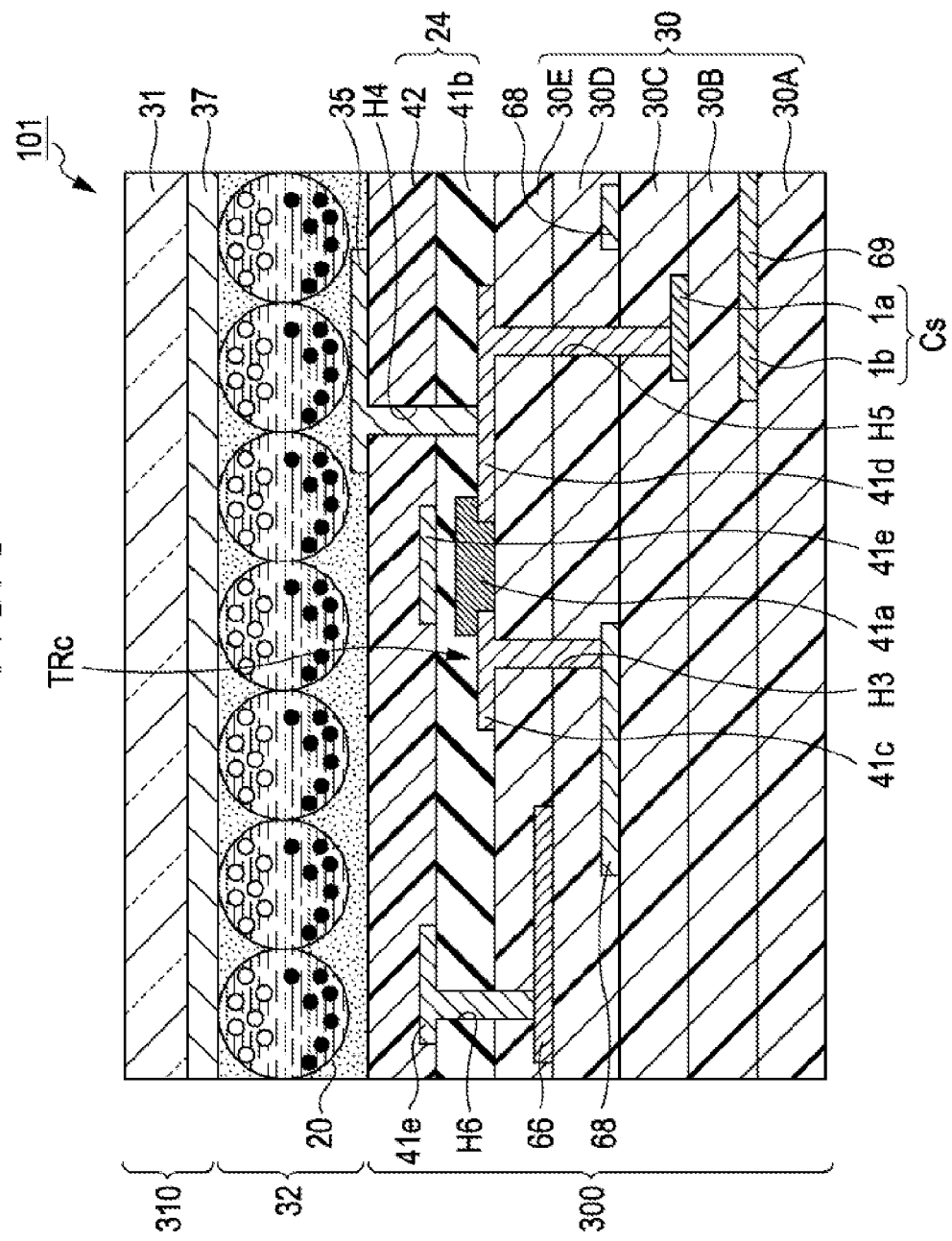
FIG. 6 is a partial cross-sectional view showing the schematic configuration of an electrophoretic display device including the above-described component substrate.

FIG. 6 is a partial cross-sectional view showing the schematic configuration of an electrophoretic display device including the above-described component substrate.

The electrophoretic display device (electric apparatus) 101 shown in FIG. 6 is configured by arranging an opposing substrate 310 on the above-described component substrate 300 through an electrophoretic layer that is used as an electro-optical layer (display element) 32. In the opposing substrate 310, on a second substrate 31 formed from PET having a thickness of 100 μm, an opposing electrode 37 formed from ITO having a thickness of 0.1 μm is formed. The electrophoretic layer (the electro-optical element 32) is formed by arranging a plurality of microcapsules 20. A display is made as white particles and black particles that are held inside the microcapsules 20 and charged with opposite polarities move in accordance with a voltage applied between the pixel electrode 35 and the opposing electrode 37.

In addition, for the configuration of the electrophoretic layer, a method using not the microcapsules 20 but other partitions such as partition walls may be used, and a configuration in which there is no partition may be employed.

Figure 7:
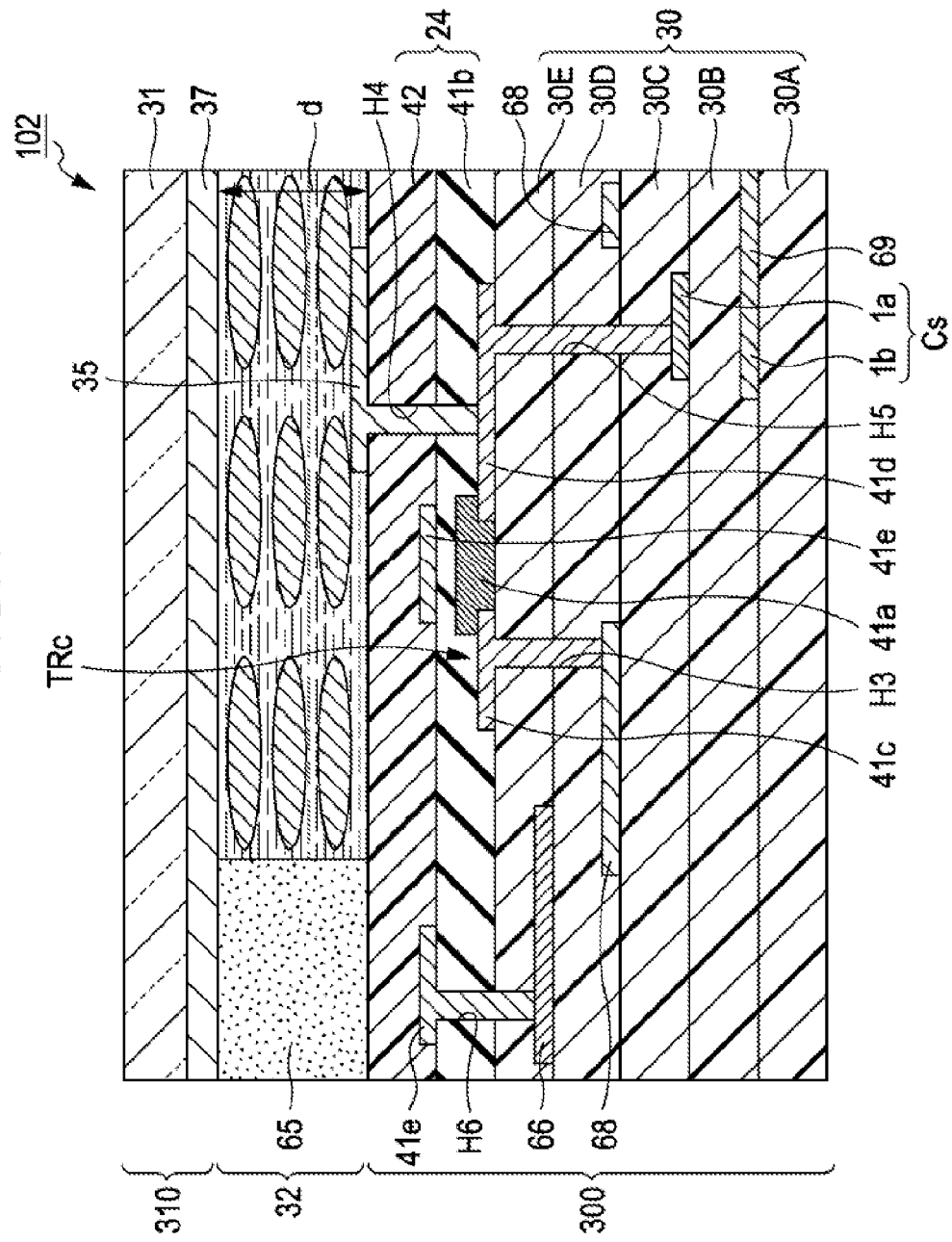
FIG. 7 is a partial cross-sectional view showing a schematic configuration of a liquid crystal device including the above-described component substrate.

FIG. 7 is a partial cross-sectional view showing a schematic configuration of a liquid crystal device including the above-described component substrate.

The liquid crystal device (electric apparatus) 102 shown in FIG. 7 is configured by arranging an opposing substrate 310 on the above-described component substrate 300 through a liquid crystal layer that is used as the electro-optical layer (display element) 32. This opposing substrate 310 has a configuration that is similar to that of the opposing substrate of the above-described electrophoretic display device.

As the liquid crystal material, a material such as a guest host liquid crystal, a PDLC (Polymer Dispersed Liquid Crystal), and a PNLC (Polymer Network Liquid Crystal), for which the influence of the cell gap d is low, is used. Generally, the optical design of the liquid crystal is performed based on a product $\Delta n \cdot d$ of a cell gap d and the anisotropy $\Delta n$ of the refractive index. In a case where a flexible substrate is used, when the liquid crystal display device is allowed to be bent, the cell gap changes. Accordingly, there is a case where the display color or the contrast is shifted when the liquid crystal display device is rolled in a cylindrical shape or the like. Accordingly, it is preferable to use the above-described liquid crystal materials. However, another liquid crystal material may be used.

Here, in a case where a liquid crystal material is used, since the liquid crystal material does not have a memory property, it is preferable to arrange a volatile memory such as an SRAM in each pixel.

In addition, a polarizing plate is necessary in the case of the liquid crystal device. In contrast to this, in the case of the above-described electrophoretic display device, a polarizing plate is not necessary, and a bright display can be realized.

Furthermore, instead of the liquid crystal material, electroluminescence, electrochromic, electrowetting, or the like may be used.

As above, in an electro-optical device that is configured by using a liquid crystal material or an electrophoretic material, as the material of the first substrate 30 that configures the component substrate 300 and the second substrate 31 that configures the opposing substrate 310, a polyimide material having flexibility is used. Generally, the material having flexibility is an organic material, and the organic material has a linear expansion coefficient having one order or magnitude more than the inorganic material that is rigid and a heat transfer coefficient having one order of magnitude less than the inorganic material. Accordingly, when the component substrate 300 generates heat, the heat can be easily collected, so that the substrate grows. Therefore, a bending state occurs in the electro-optical device. In addition, in this state, when the electro-optical device is used in a bent state, there is a concern that a defect in the connection between the electronic component 22 and the wiring, disconnection of the wiring, or the like may occur. Generally, an electro-optical device using electroluminescence is disclosed in which heat is not collected in a component substrate by using an in organic substrate including a heat diffuser. However, the structure thereof is complicated.

In addition, the component substrate 300 (first substrate 30) that is formed from a material having flexibility or an organic material as its main constituent is included. In a case where the electro-optical device 100 according to this embodiment or the like is used in a bent state, it is preferable to use a material generating a small amount of heat as an electro-optical material (electro-optical element). The material that generates a small amount of heat is a material that has a low current or a low voltage when a display is performed. The most preferable material is an electro-optical material that has a memory property and can maintain the display even any voltage is not applied after a voltage has been applied thereto once. More specifically, the most preferable material is an electrophoretic material or an electrochromic material. A material that is preferable next thereto is a material that is driven not by a current but by a voltage such as a liquid crystal or an electrowetting material.

The least preferable material is electroluminescence that is driven by a current.

In addition, as examples of the material used for the first substrate 30 and the second substrate 31 of the component substrate 300, there are polyester, PET, or other organic and inorganic materials that have flexibility. In addition, as materials having no flexibility, BT resin, an allylating phenylene resin, a liquid crystal polymer, PEEK, epoxy resin, paper phenol, paper epoxy, glass composite, glass epoxy, thin glass, Teflon (registered trademark), ceramics, a composite material thereof, and other organic and inorganic materials may be used.

In addition, by using a non-woven fabric or a woven fabric, which is coated with an organic material such as rubber or acryl, having stretchability, stretchability can be implemented.

Furthermore, as a material used for the pixel electrode 35, the opposing electrode 37, the source electrode 41c, the drain electrode 41d, the gate electrode 41e, the holding capacitor electrodes 1a and 1b of the holding capacitor Cs, and various wirings (the scanning line 66, the data line 68, the holding capacitor line 69, and the like), a metal paste other than Cu or Au, metal, an organic conductive material such as carbon nanotubes, an inorganic conductive material, a transparent electrode (ITO), or the like may be used.

In addition, the signal line or the power supply line may be configured to be buried inside the first substrate 30 as an embedded wiring.

In addition, the number or the thickness of base members that configure the first substrate 30 is not limited to those described above. Furthermore, the base member may be changed for each layer. The positions of the wiring, the IC, and the electronic components are not restricted at all. In addition, the first substrate 30 may not be a multi-layer substrate but be a single-layer substrate as long as the electronic components, the wirings and the electrodes of the TFT can be buried in the first substrate 30. In order to secure high holding capacitance Cs, the base member (interposed between the electrodes 1a and 1b) configuring the holding capacitor or a part thereof may be formed to be thin, or the material thereof may be replaced by a high-permittivity material.

In addition, as the configuration of the pixel circuit, a former-stage gate capacitance type may be employed in which the capacitance is maintained in the holding capacitor Cs by a former-stage scanning line 66.

By employing a configuration in which the holding capacitor Cs is buried inside the first substrate 30, a large area for forming the holding capacitor Cs can be secured. In a general configuration, since the TFT, various wirings, and the like are present within the same plane, sufficient formation areas cannot be secured. Thus, as in this embodiment, by burying the holding capacitor Cs at a position other than the position of the TFT, that is, inside the first substrate 30, it is possible to sufficiently secure the formation areas of the control transistor TRc and the holding capacitor Cs.

Here, in FIGS. 2 to 7, the holding capacitor Cs is illustrated at a position at which the scanning line 66 and the data line 68 do not overlap each other in the plan view. However, in practical applications, since the scanning line 66 and the data line 68 are formed in different layers, they may overlap each other in the plan view.

By securing a sufficient formation area of the holding capacitor Cs, the content accumulated in the holding capacitor Cs increases. When the content is large, the number of times of rewriting for switching between images decreases, and accordingly, a decrease in the power consumption, a decrease in the flicker or the burn-in, an increase in the contrast, and the like are realized.

For example, in a case where an electrophoretic material is used as the electro-optical material, the amount of charge used for moving charged particles is necessary. The amount of charge that is maintained by one writing operation for one pixel is Cs×V (here, V is the amount of charge written into the holding capacitor Cs). When the amount of charge that is necessary for moving the charged particles is Q, the number of times of rewriting for rewriting the screen of the electrophoretic display device can be acquired by using the following Equation (1).

$$N=Q/(Cs \times V) \qquad \text{Equation (1)}$$

In addition, according to the above-described embodiment, since the scanning line 66, the data line 68, the holding capacitor line 69, and the like are configured to be buried inside the first substrate 30, a large formation area of the control transistor TRc can be secured.

In the above-described embodiment, although the scanning line driving circuit 61 and the data line driving circuit 62 that drive pixel TFTs are configured to be buried inside the first substrate 30 (component substrate 300), a different method may be used. A so-called built-in driver in which a driving circuit is configured by using TFTs may be used, and a COG system in which an IC chip is directly mounted on the first substrate 30 or a configuration in which a flexible substrate in which an external circuit is mounted is connected to the first substrate 30 may be employed. Furthermore, a configuration may be employed in which an external circuit and the like are buried and built inside the component substrate 300 (the first substrate 30).

The electro-optical device as shown in FIGS. 6 and 7 is used by repeatedly being folded like a paper sheet in practical applications. Accordingly, the reliability of the connection between the electrodes and the electronic components 22 disposed on the first substrate 30 is extremely important.

Second Embodiment

Next, the configuration of a component substrate according to a second embodiment will be described.

Figure 8:
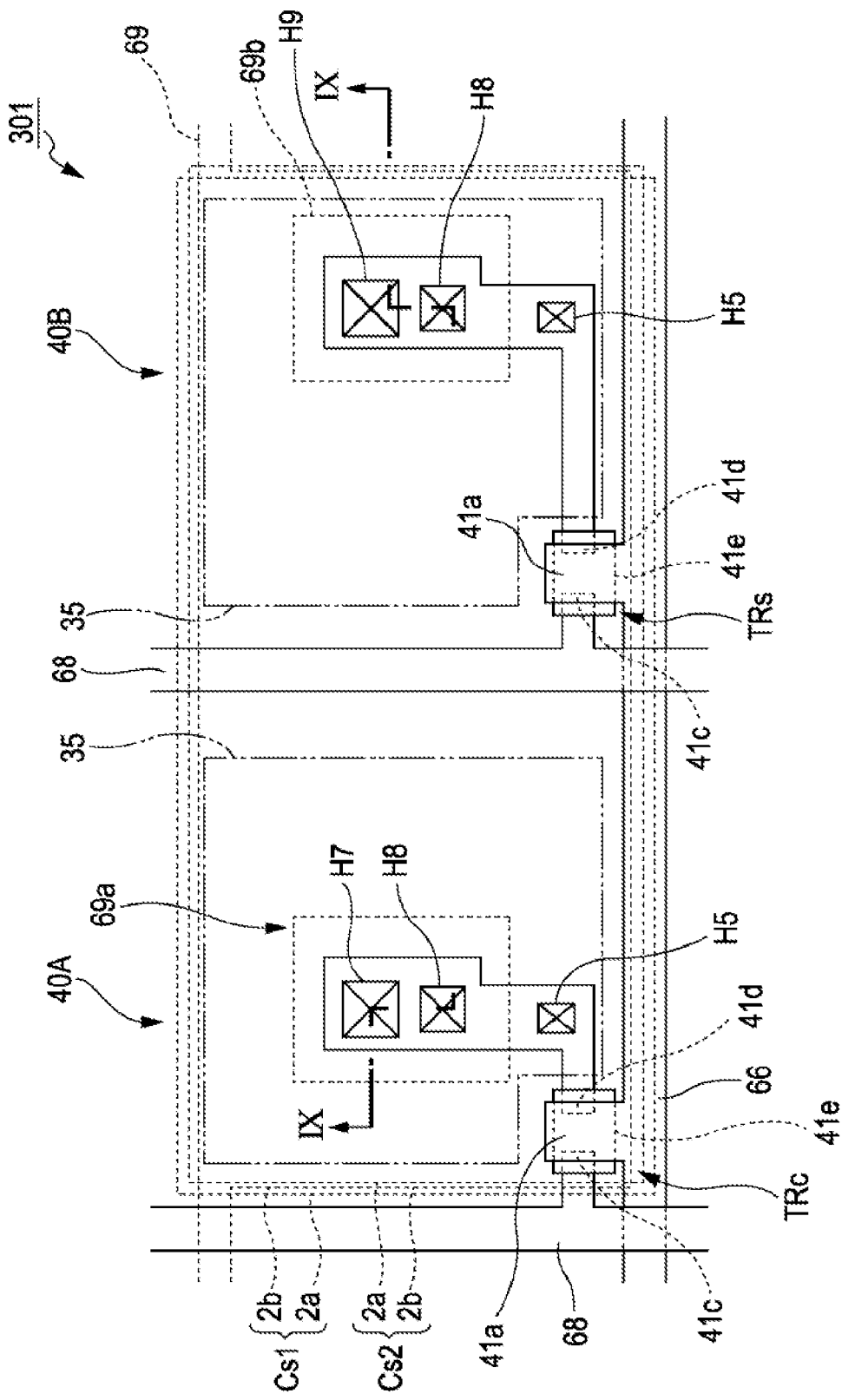
FIG. 8 is a plan view showing a pixel configuration formed on a component substrate according to a second embodiment.
Figure 9:
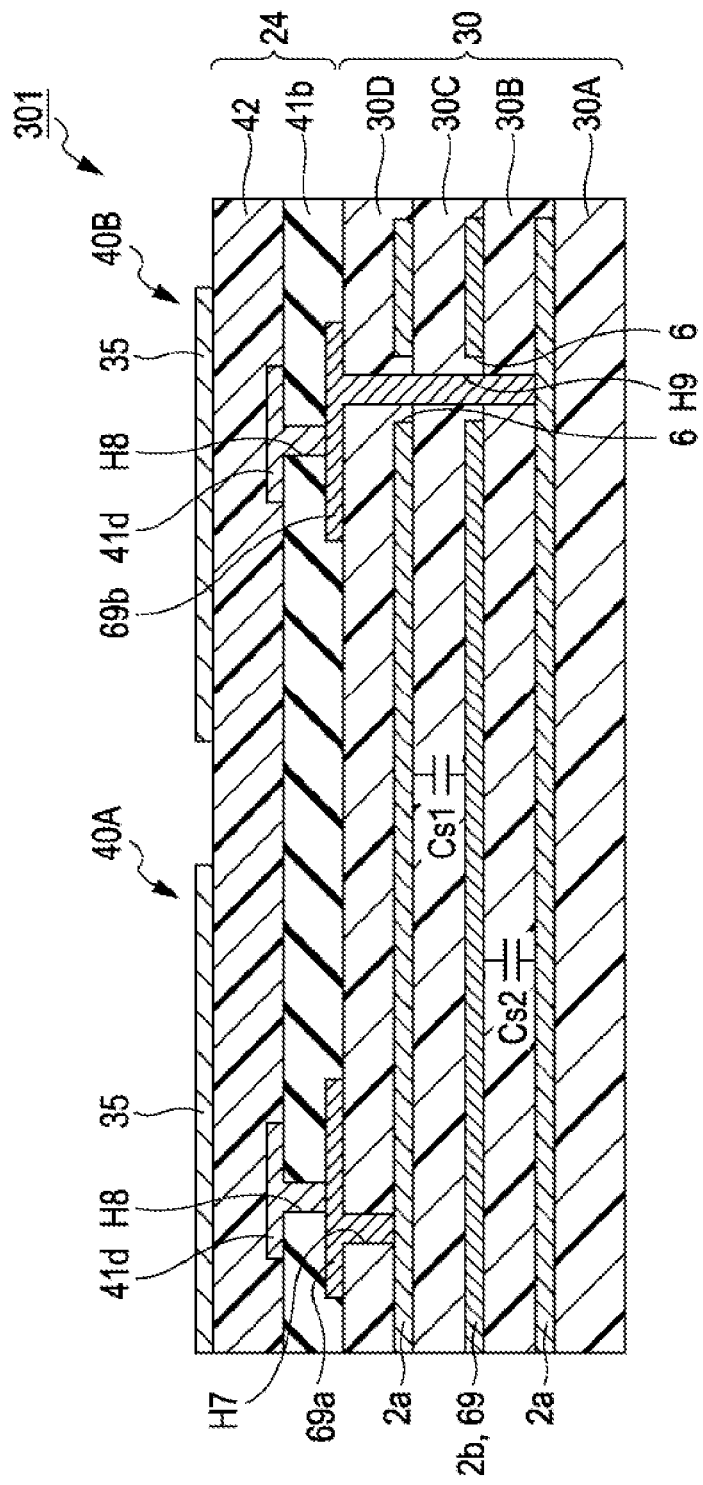
FIG. 9 is a cross-sectional view taken along line IX-IX shown in FIG. 8.

FIG. 8 is a plan view showing a pixel configuration formed on a component substrate according to the second embodiment. FIG. 9 is a cross-sectional view taken along line IX-IX shown in FIG. 8. A pixel TFT has a bottom-gate and bottom-contact structure. Holding capacitor connection portions 69a and 69b are disposed on a first substrate 30 in the same layer as that of a gate electrode 41e.

As shown in FIGS. 8 and 9, in this embodiment, inside the first substrate 30 configuring a component substrate 301, holding capacitors Cs1 and Cs2 are buried over two pixels 40A and 40B adjacent to each other. Each one of the holding capacitors Cs1 and Cs2 is configured by one of one pair of the holding capacitor electrodes 2a that are formed in different layers and a holding capacitor electrode 2b arranged therebetween. Each of the holding capacitor electrodes 2a and 2b represents a rectangular shape in the plan view and has a size covering the pixel area of each of two pixels 40A and 40B that are adjacent to each other in the extending direction of the scanning line 66.

Here, the holding capacitor electrode 2b that is used in common by the holding capacitors Cs1 and Cs2 extends by a holding capacitor line 69.

The first substrate 30 is acquired by laminating four base members 30A to 30D that are formed from polyimide. On the base member 30A, the holding capacitor electrode 2a that is one electrode of the holding capacitor Cs2 is formed.

On the base member 30B, the holding capacitor electrode 2b is formed. This holding capacitor electrode 2b is arranged at a position facing the above-described holding capacitor electrode 2a that is located on the lower layer side of the holding capacitor electrode 2b and configures the holding capacitor Cs2 together with the holding capacitor electrode 2a.

In addition, on the base member 30B, the base member 30C is further laminated so as to cover the holding capacitor electrode 2b (holding capacitor line 69), and, on the surface of the base member 30C, the holding capacitor electrode 2a facing the holding capacitor electrode 2b in the plan view is formed. The holding capacitor Cs1 is configured by the holding capacitor electrode 2a and the holding capacitor electrode 2b that is located on the lower layer side of the holding capacitor electrode 2a.

On the base member 30C, the base member 30D is disposed so as to cover the holding capacitor electrode 2a, and, on the surface thereof, holding capacitor connecting portions 69a and 69b are formed. The holding capacitor connecting portion 69a disposed inside the pixel 40A is connected to the holding capacitor electrode 2a that is arranged on the base member 30C through a contact hole H7 passing through the base member 30D. The holding capacitor connecting portion 69b disposed inside the pixel 40B is connected to the holding capacitor electrode 2a that is arranged on the base member 30A through a contact hole H9 passing through the base members 30B to 30D.

Here, in the holding capacitor electrode 2b arranged on the base member 30B and the holding capacitor electrode 2a arranged on the base member 30C, a through hole 6 for allowing the contact hole H9 to be inserted into and pass through it is formed.

A gate insulating film 41b is formed on the entire surface of the base member 30D so as to cover the holding capacitor connecting portions 69a and 69b. In FIG. 9, the other constituent elements of the control transistor are not shown. On the gate insulating film 41b, a drain electrode 41d (source electrode 41c: FIG. 8) of the control transistor TRc is disposed in each one of the pixels 40A and 40B. The drain electrode 41d located on the pixel 40A side is connected to the holding capacitor connecting portion 69a through a contact hole H8 passing through the gate insulating film 41b, and the drain electrode 41d located on the pixel 40B side is connected to the holding capacitor connecting portion 69b through the contact hole H8 passing through the gate insulating film 41b.

In addition, a protection layer 42 is formed so as to cover drain electrodes 41d and 41d disposed in the pixels 40A and 40B, and, on the surface thereof, pixel electrodes 35 corresponding to the pixels 40A and 40B are disposed. Each pixel electrode 35 is connected to the drain electrode 41d of the control transistor TRc of each one of the pixels 40A and 40B through a contact hole H5 (FIG. 8) disposed in the protection layer 42.

According to this embodiment, a formation area of the holding capacitor Cs, which is larger than that of the configuration according to the first embodiment, can be secured. Here, the materials and the thicknesses of the base member (insulating member) 30B and the base member (insulating member) 30C that are present between the holding capacitor electrodes 2a and 2b of the holding capacitor Cs may be changed. For example, the capacitance can be set to be high by forming the thicknesses thereof to be thinner or replacing the material with a material having high specific permittivity. When the material is changed, only an area used for the holding capacitor Cs may be changed.

Third Embodiment

Next, the configuration of a component substrate according to a third embodiment will be described.

Figure 10:
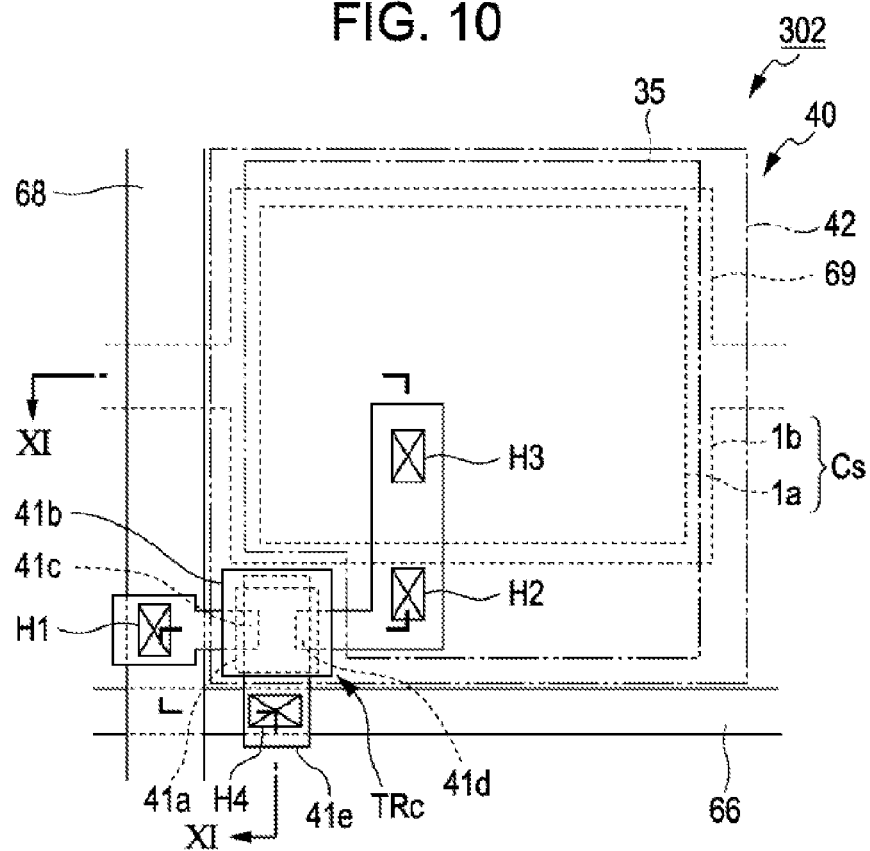
FIG. 10 is a plan view showing a pixel configuration formed on a component substrate according to a third embodiment.
Figure 11:
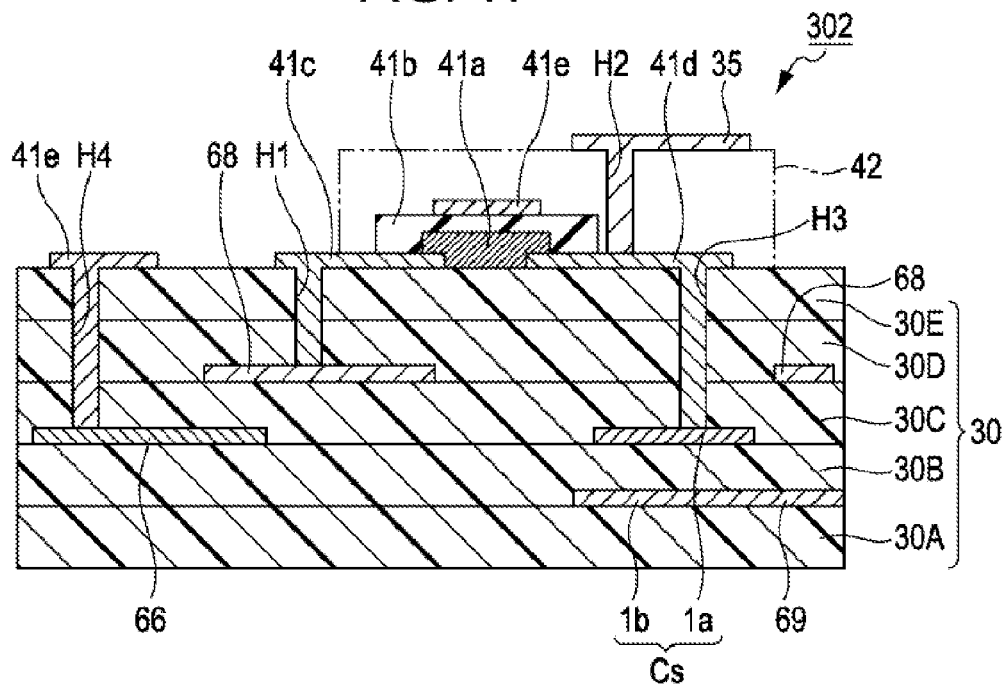
FIG. 11 is a cross-sectional view taken along line XI-XI shown in FIG. 10.

FIG. 10 is a plan view showing a pixel configuration of the component substrate according to the third embodiment. FIG. 11 is a cross-sectional view taken along line XI-XI shown in FIG. 10.

As shown in FIGS. 10 and 11, in this embodiment, a gate insulating film 41b of a control transistor TRc and a protection layer 42 are not formed on the entire surface of the component substrate 302 (first substrate 30) but are disposed for each pixel.

In a part (near an intersection of the scanning line 66 and the data line 68) of the pixel area, the gate insulating film 41b is selectively formed so as to cover the entire semiconductor layer 41a formed on the first substrate 30 and parts of the source electrode 41c and the drain electrode 41d. A gate electrode 41e is disposed at a position located on the gate insulating film 41b that faces the semiconductor layer 41a.

In addition, the protection layer 42 is disposed in an approximately entire area of the pixel area so as to cover the gate insulating film 41b and a gate electrode 41e. The pixel electrode 35 is arranged on the surface of the protection layer 42 and is formed in a size not protruding from the protection layer 42.

In this embodiment, a plurality of the gate insulating films 41b of the control transistor TRc and a plurality of the protection layers 42 are arranged for each pixel and are formed in minimum sizes that are necessary. By selectively forming the gate insulating films 41b and the protection layer 42 only at necessary areas, the cost required for the materials can be reduced.

In addition, one side of the gate insulating films 41b and the protection layers 42 may be selectively arranged inside the pixel area.

FIGS. 12A to 12D are cross-sectional views showing the configurations of a connection between the source electrode of the control transistor and a data line.

Figure 12A:
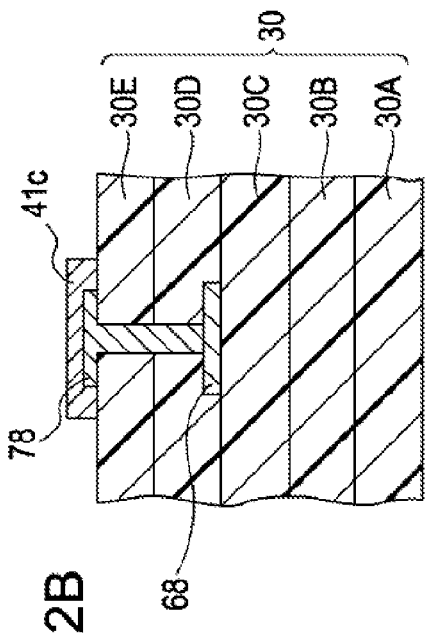
FIGS. 12A to 12D are cross-sectional views showing the configurations of a connection between a source electrode of a control transistor and a data line.

In FIG. 12A, a source electrode 41c formed on the first substrate 30 (base member 30E) is connected to a data line 68 disposed on a base member 30C through a contact hole H passing through the base members 30D and 30E. In this case, when the first substrate 30 is bent, the source electrode 41c can be easily removed from the surface of the first substrate 30 (the base member 30E), whereby there is a concern that a defective connection between the source electrode 41c and the data line 68 may occur.

Figure 12B:
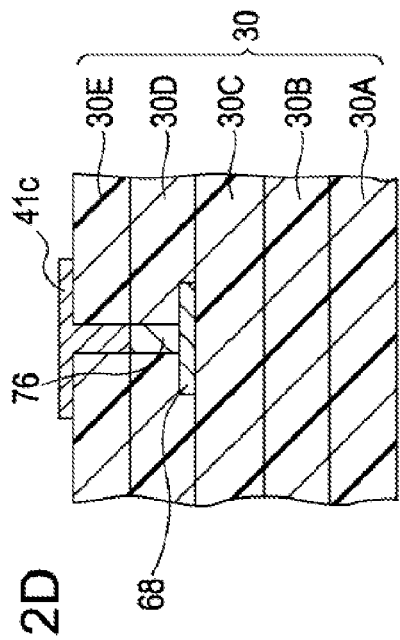
Figure 12C:
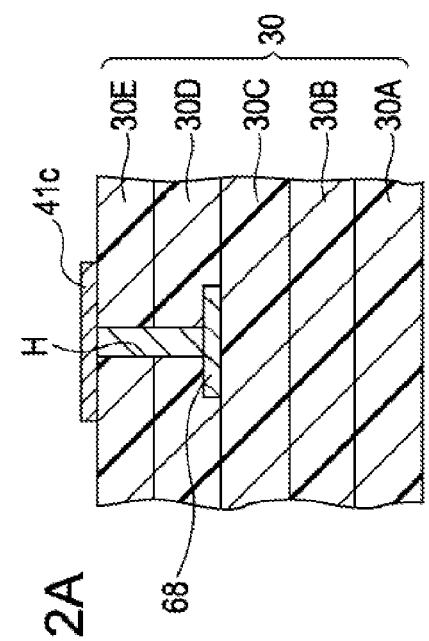
Figure 12D:
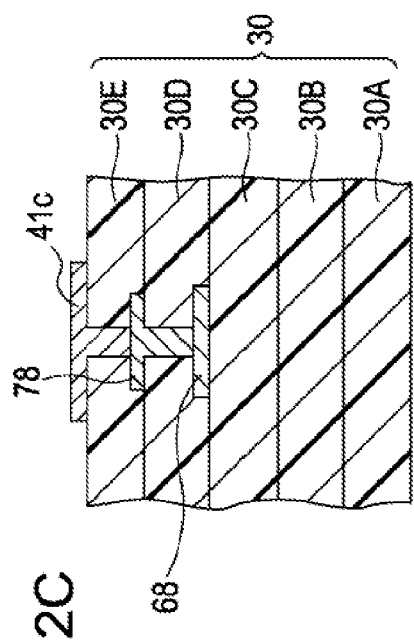

Thus, the connection structures as shown in FIGS. 12B to 12D may be considered to be employed.

In FIG. 12B, a connection terminal 78 is disposed on a first substrate 30, and a source electrode 41c is formed so as to cover the entire surface of the connection terminal 78. A part of the connection terminal 78 is buried inside the base members 30D and 30E and reaches the surface of the data line 68.

As above, by burying a part of the connection terminal 78 inside the first substrate 30 and forming the source electrode 41c so as to cover the entire surface of the connection terminal 78, even in a case where the component substrate (the first substrate 30) is bent, the source electrode 41c and the connection terminal 78 are prevented from being removed from the upper side of a base member 30E. Accordingly, the connection state of the source electrode 41c and the connection terminal 78, that is, the connection state of the source electrode 41c and the data line 68 can be maintained to be good.

In FIG. 12C, a source electrode 41c formed on a first substrate 30 is connected to a data line 68 located on the lower side through a connection terminal 78 buried inside the first substrate 30. A connection terminal 78 is disposed on the surface of a base member 30D that covers the data line 68, and a part thereof is buried inside the base member 30D, thereby reaching the surface of the data line 68. The source electrode 41c is disposed on the surface of a base member 30E, and a part thereof is buried inside the base member 30E, thereby reaching the surface of the connection terminal 78.

As above, by burying a part of the source electrode 41c and a part of the connection terminal 78 inside the base member, even in a case where the substrate (the first substrate 30) is used in a bent state, the state of the connection between the source electrode 41c and the data line 68 can be maintained to be good.

In FIG. 12D, a source electrode 41c is formed on the surface of a base member 30E, and a part thereof is buried inside the base member 30E, thereby being connected to a data line 68 through a conductive material 76 buried inside a base member 30D. Even in such a configuration, in a case where the component substrate (the first substrate 30) is used in a bent state, the state of the connection between the source electrode 41c and the data line 68 can be maintained to be good.

The same configuration may be employed not only in the connection portion between the source electrode 41c and the data line 68 but also in a connection portion between the drain electrode 41d and a holding capacitor electrode 1a of a holding capacitor Cs and a connection portion between the gate electrode 41e and the scanning line 66. In addition, it is apparent that the configuration may be applied to a connection portion between another power supply line and a signal line. Accordingly, even in a case where the component substrate 300 is used in a bent state, the state of the connection between the drain electrode 41d and the holding capacitor electrode 1a the holding capacitor Cs and the state of the connection between the gate electrode 41e and the scanning line 66 can be maintained to be good.

In FIGS. 12C and 12D, the source electrode 41c included in the middle of the base member 30E is disposed so as to bury a contact hole disposed in the base member 30E. However, the structure is not limited thereto. Thus, a state may be formed in which the source electrode 41c covers a side wall of the base member 30E and the surfaces of conductive materials 76 and 78 as connection destinations, and the side wall and the surfaces of the conductive materials are connected to the surface of the base member 30E. In other words, for example, like a state formed by using a sputtering method, a state may be configured in which a space is arranged inside the contact hole in the plan view.

In addition, an upper side of the base member 30E may be configured by using a plurality of layers, for example, including two metal layers and a signal layer formed inside of the contact hole. At this time, one of the plurality of layers is formed simultaneously in both the contact hole and the surface of the base member 30E.

It is apparent that such a connection method is also used for a connection between the drain electrode 41d and the gate electrode 41e or the pixel electrode 35 and an embedded wiring.

Fourth Embodiment

Next, the configuration of a component substrate according to a fourth embodiment will be described.

Figure 13:
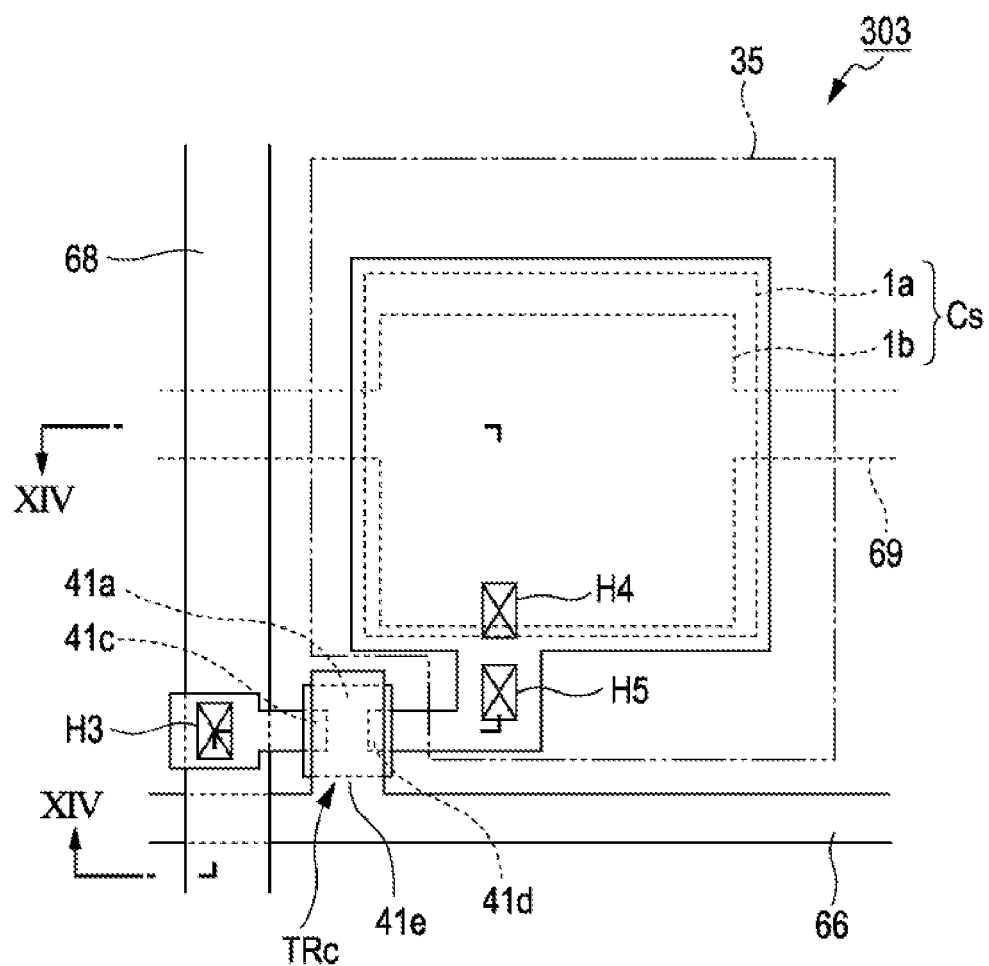
FIG. 13 is a plan view schematically showing the configuration of one pixel on a component substrate according to a fourth embodiment.
Figure 14A:
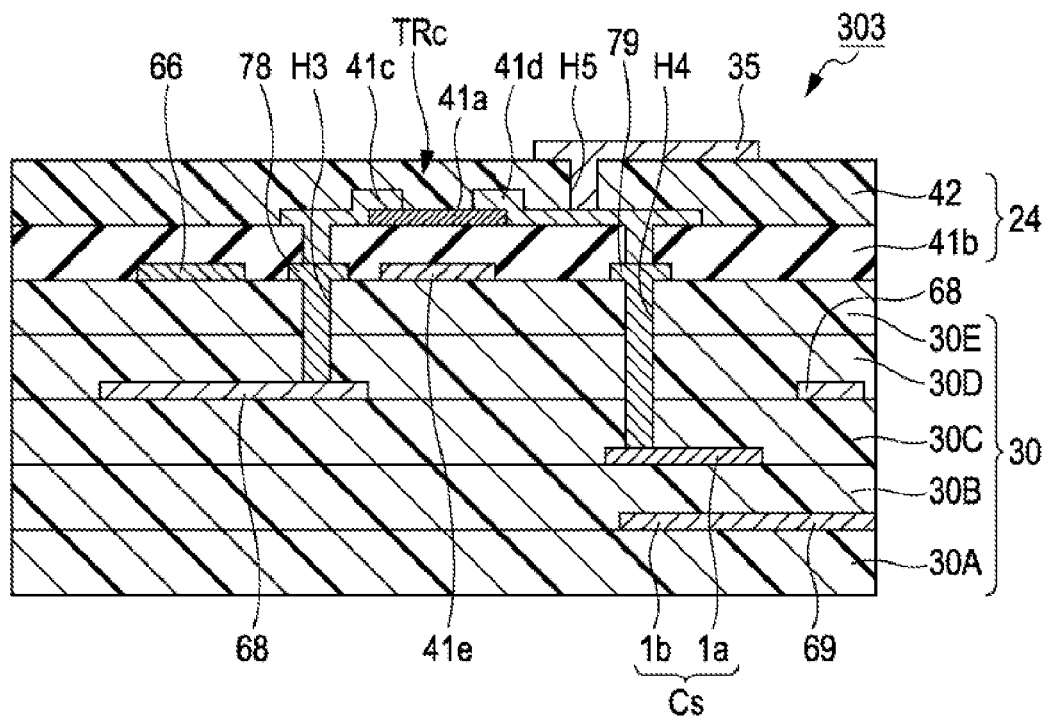
FIG. 14A is a cross-sectional view taken along line XIVA-XIVA shown in FIG. 13.

FIG. 13 is a plan view schematically showing the configuration of one pixel on a component substrate according to the fourth embodiment. FIG. 14A is a cross-sectional view taken along line XIVA-XIVA shown in FIG. 13.

As shown in FIGS. 13 and 14A, the component substrate 303 according to this embodiment includes a control transistor TRc having a bottom-gate and top-contact (BGTC) structure. Here, this control transistor TRc and a scanning line 66 is formed on a first substrate 30, and a data line 68 and a holding capacitor Cs (holding capacitor electrodes 1a and 1b) are buried inside the first substrate 30.

On the first substrate 30 (base member 30E), a gate electrode 41e and the scanning line 66 are formed. In addition, a connection terminal 78 used for connecting a source electrode 41c of the control transistor TRc and the data line 68 and a connection terminal 79 that is used for connecting a drain electrode 41d and a holding capacitor electrode 1a of the holding capacitor Cs are arranged. A part (forming material) of the connection terminal 78 is buried inside a through hole passing through base members 30D and 30E in the thickness direction so as to be connected to the data line 68, and a part of the connection terminal 79 is buried inside a through hole passing through base members 30C to 30E so as to be connected to the holding capacitor electrode 1a. The connection terminals 78 and 79 cover a part of the surface of the base member 30E, and a part thereof is buried inside the base member 30E. Accordingly, a configuration is formed in which the occurrence of peeling-off from the surface of the base member 30E can be prevented even in a case where the component substrate 303 is bent.

In addition, a gate insulating film 41b is formed on the entire surface of the base member 30E so as to cover the scanning line 66, the gate electrode 41e, and the connection terminals 78 and 79, and a semiconductor layer 41a and a source electrode 41c and a drain electrode 41d formed so as to be seated on the peripheral edge of the semiconductor layer 41a are disposed thereon. The source electrode 41c is configured to be connected to the data line 68 through a contact hole H3, and a drain electrode 41d is configured to be connected to one holding capacitor electrode 1a of the holding capacitor Cs through a contact hole H4.

Here, the source electrode 41c and the drain electrode 41d are connected to the connection terminals 78 and 79 by forming parts thereof so as to be buried inside the gate insulating film 41b.

The contact hole H3 is formed by the material of the connection terminal 78, and the contact hole H4 is formed by the material of the connection terminal 79.

On the surface of the protection layer 42 that covers the gate insulating film 41b, pixel electrodes 35 for pixels are formed in a matrix pattern, and a part of each pixel electrode 35 is buried inside the protection layer 42. The pixel electrode 35 is connected to the drain electrode 41d of the control transistor TRc through a contact hole H5 formed by burying a part thereof inside the protection layer 42.

As this embodiment, even in a case where a control transistor TRc having the top-gate and top-contact structure is used, by burying the data line 68 and the holding capacitor Cs (the holding capacitor line 69) inside the first substrate 30, the formation of a short circuit and the like thereof can be prevented well, compared to a case where the data line 68 and the holding capacitor Cs are configured to be drawn out in a circular form on the first substrate 30.

Figure 14B:
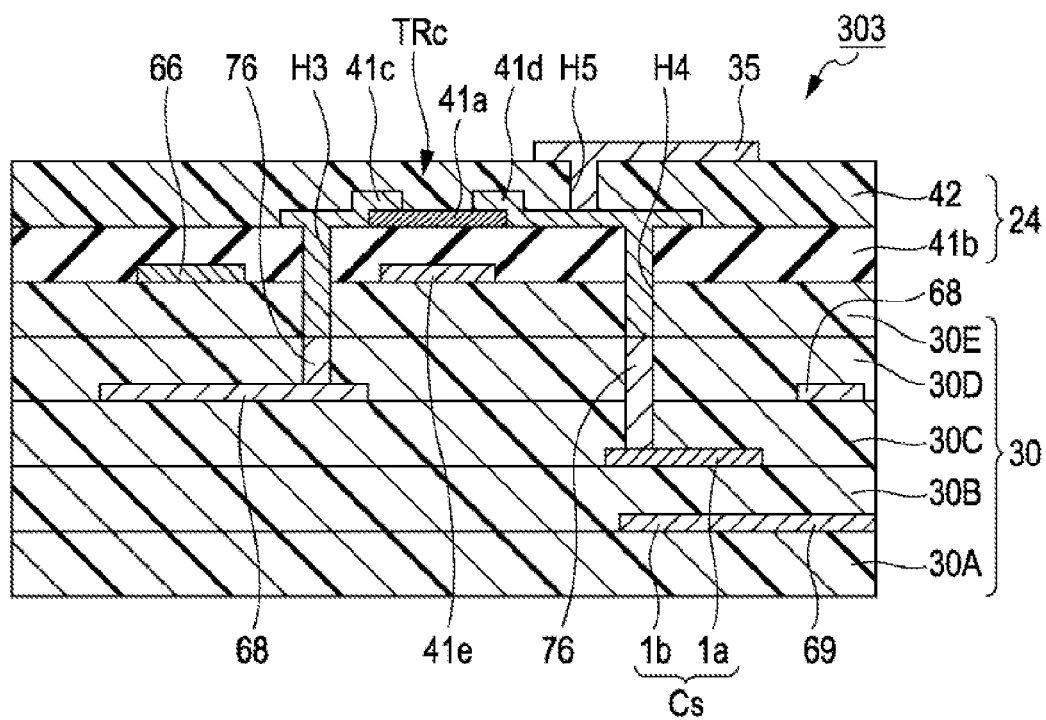
FIG. 14B is a cross-sectional view showing a modified example of a component substrate.

FIG. 14B is a cross-sectional view showing a modified example of the component substrate according to this embodiment.

As shown in FIG. 14B, the contact hole H3 that connects the source electrode 41c of the control transistor TRc and the data line 68 may be configured by a part (forming material) of the source electrode 41c, and the contact hole H4 that connects the drain electrode 41d and the holding capacitor electrode 1a may be configured by a part (forming material) of the drain electrode 41d. More specifically, the source electrode 41c and the drain electrode 41d are configured to be not only on the gate insulating film 41b but also inside the base member 30D that configures the first substrate 30. Even by employing such a configuration, even in a case where the component substrate 303 is bent, the state of the connection between the source electrode 41c and the data line 68 and the state of the connection between the drain electrode 41d and the holding capacitor electrode 1a can be maintained to be good.

Fifth Embodiment

Next, the configuration of a component substrate according to a fifth embodiment will be described.

Figure 15:
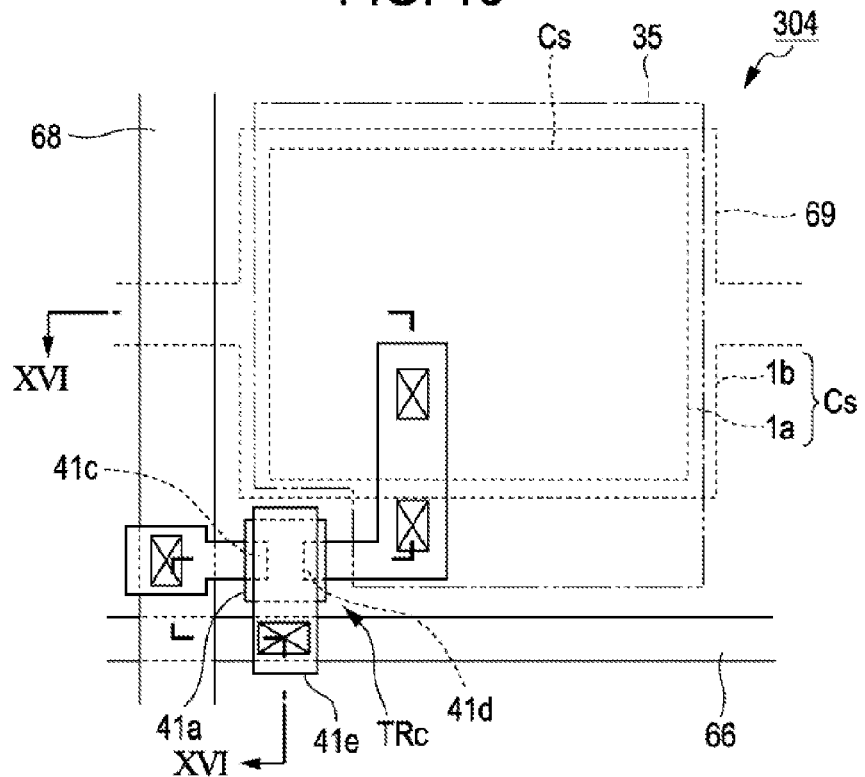
FIG. 15 is a plan view schematically showing the configuration of one pixel on a component substrate according to a fifth embodiment.
Figure 16:
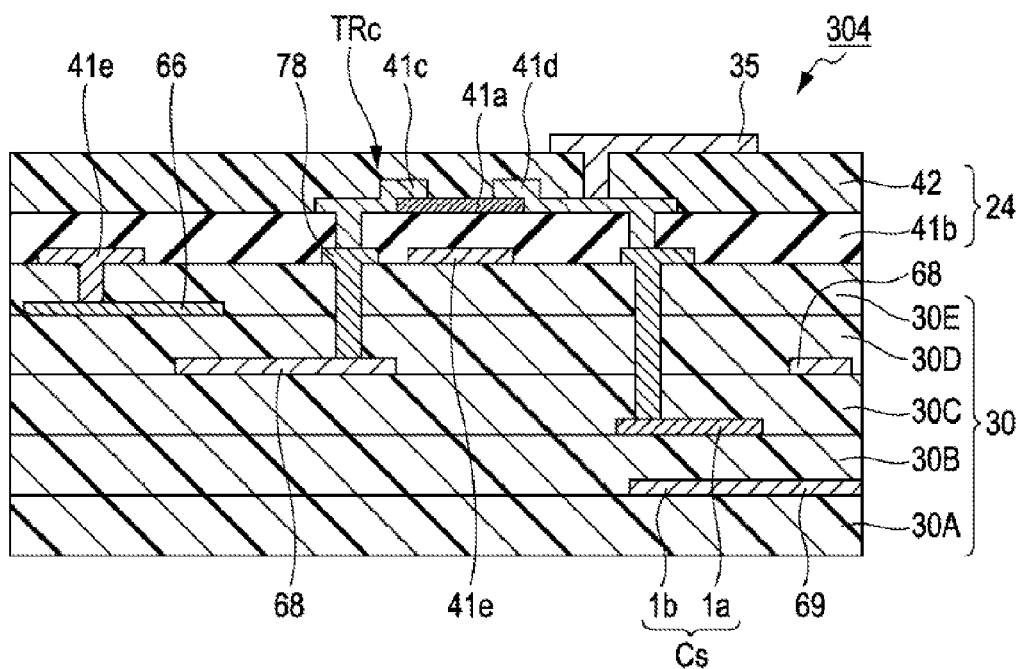
FIG. 16 is a cross-sectional view taken along line XVI-XVI shown in FIG. 15.

FIG. 15 is a plan view schematically showing the configuration of one pixel on a component substrate according to the fifth embodiment. FIG. 16 is a cross-sectional view taken along line XVI-XVI shown in FIG. 15.

As shown in FIGS. 15 and 16, the component substrate 304 according to this embodiment includes a control transistor TRc having a bottom-gate and top-contact (BGTC) structure. This control transistor TRc is formed on a first substrate 30, and a scanning line 66 and a data line 68, and a holding capacitor Cs are buried inside the first substrate 30. In addition, a gate electrode 41e is disposed on the first substrate 30, and a part thereof is buried therein so as to be connected to the scanning line 66.

As above, by burying the scanning line 66 inside the first substrate 30, the formation of a short circuit and the like of the scanning line 66 can be prevented well, compared to a case where the scanning line 66 is configured to be drawn out in a circular form on the first substrate 30. In addition, high precision of the control transistor TRc and narrowing of the frame of the electro-optical device can be realized.

Sixth Embodiment

Next, the configuration of a component substrate according to a sixth embodiment will be described.

Figure 17A:
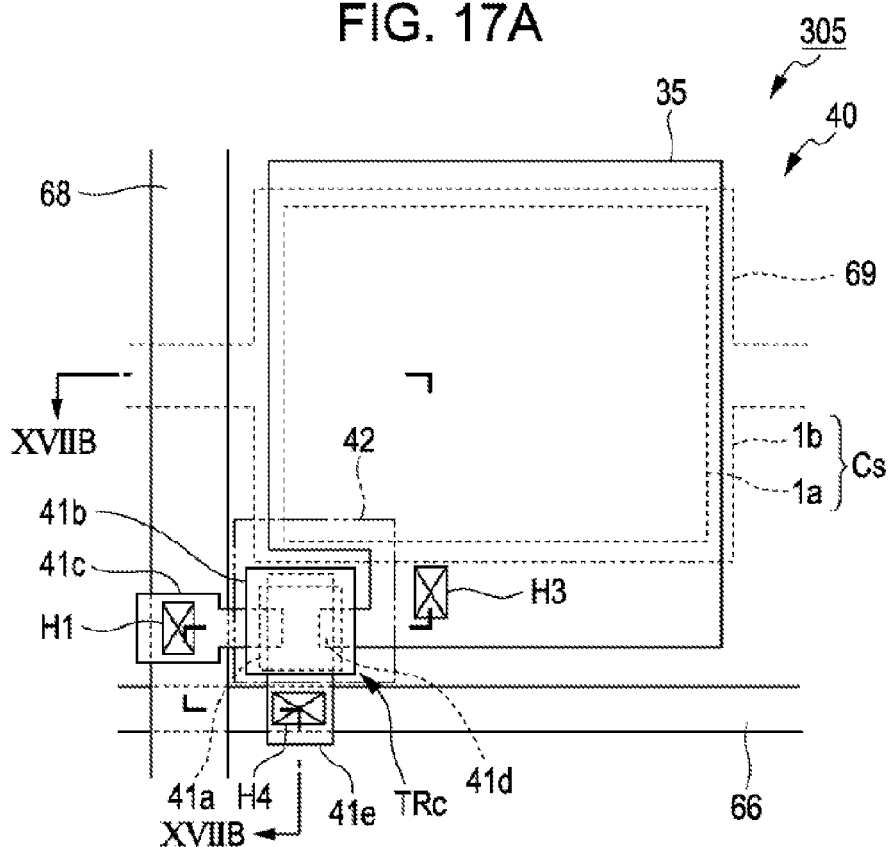
FIG. 17A is a plan view schematically showing the configuration of one pixel on a component substrate according to a sixth embodiment.
Figure 17B:
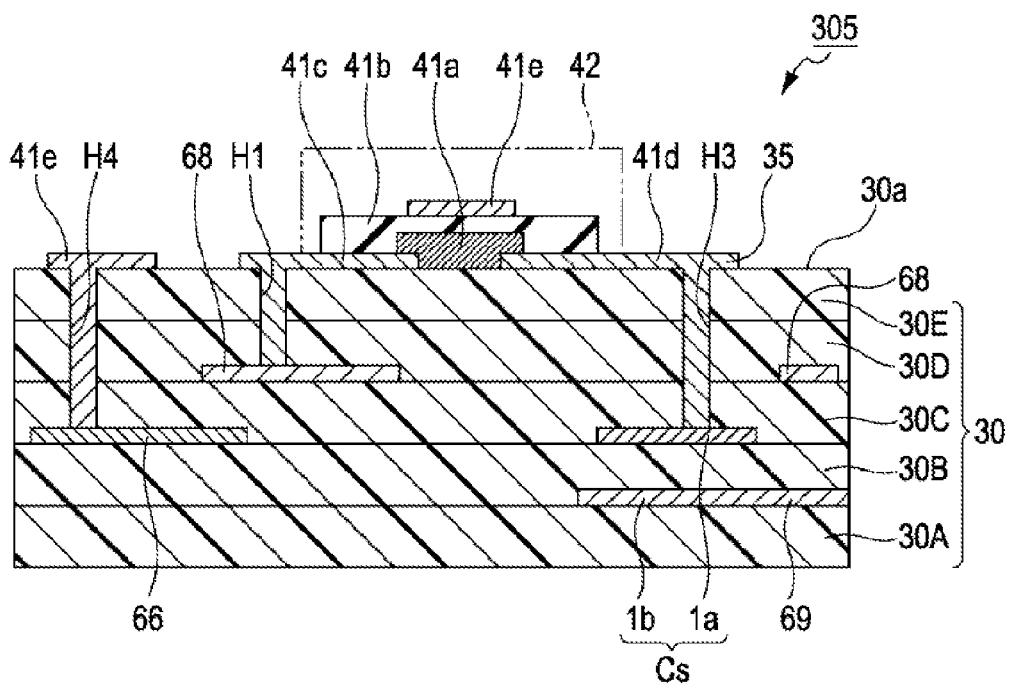
FIG. 17B is a cross-sectional view taken along line XVIIB-XVIIB shown in FIG. 17A.

FIG. 17A is a plan view schematically showing the configuration of one pixel on a component substrate according to the sixth embodiment, and FIG. 17B is a cross-sectional view taken along line XVIIB-XVIIB shown in FIG. 17A.

As shown in FIGS. 17A and 17B, the component substrate 305 according to this embodiment has a configuration in which a pixel electrode 35 is formed on the same plane as that of a source electrode 41c and a drain electrode 41d. In the previous embodiment, the pixel electrode 35 is formed on the upper layer side (a position located farther from the first substrate 30 than the drain electrode 41d) of the drain electrode 41d through a gate insulating film 41b or a protection layer 42. However, in this embodiment, the pixel electrode 35 is formed on the surface 30a of a first substrate 30 like the drain electrode 41d, which is different from the previous embodiment. Here, the gate insulating film 41b is selectively formed in a pixel area so as to cover the source electrode 41c, the drain electrode 41d, and a semiconductor layer 41a, and the protection layer 42 is formed in an approximately entire pixel area so as to cover parts of the gate insulating film 41b, which is selectively formed inside the pixel area, and the gate electrode 41e. This is the same configuration as that of the above-described third embodiment (see FIGS. 10 and 11).

In this embodiment, the pixel electrode 35 can be formed in the same process as that of the source electrode 41c and the drain electrode 41d. Accordingly, the manufacturing process can be easily performed, and the gate insulating film and the like that are arranged between the pixel electrode 35, the source electrode 41c, and the drain electrode 41d are not necessary, whereby a small thickness of the substrate can be realized.

In addition, a part of the pixel electrode 35 is buried inside the substrate such that the pixel electrode 35 is connected to a holding capacitor electrode 1a.

Seventh Embodiment

Next, the configuration of a component substrate according to a seventh embodiment will be described.

Figure 18A:
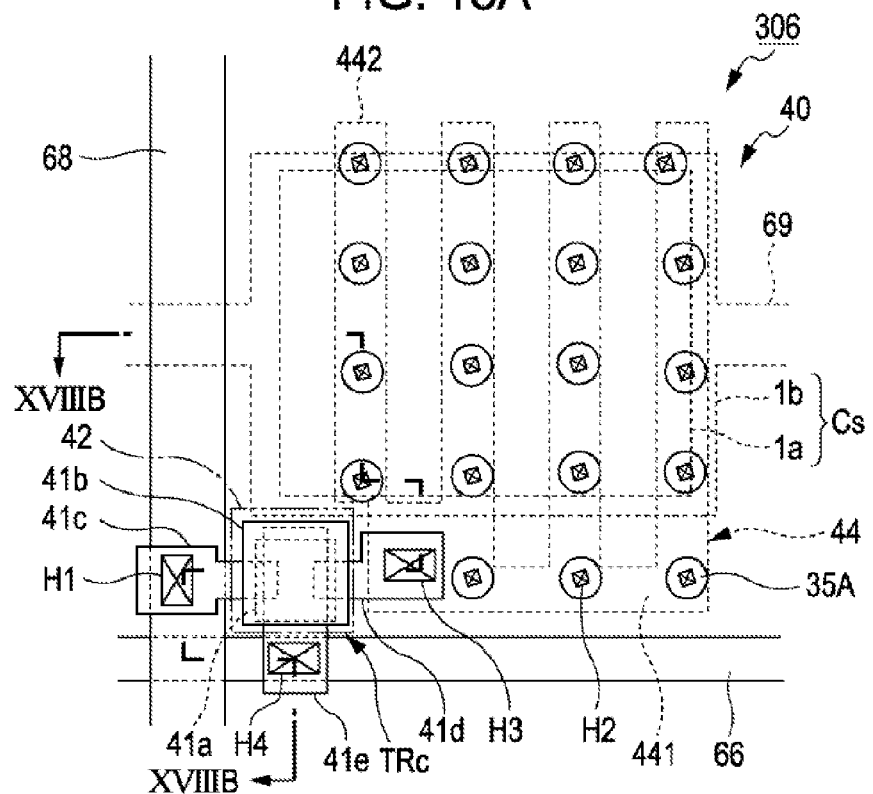
FIG. 18A is a plan view schematically showing the configuration of one pixel on a component substrate according to a seventh embodiment.
Figure 18B:
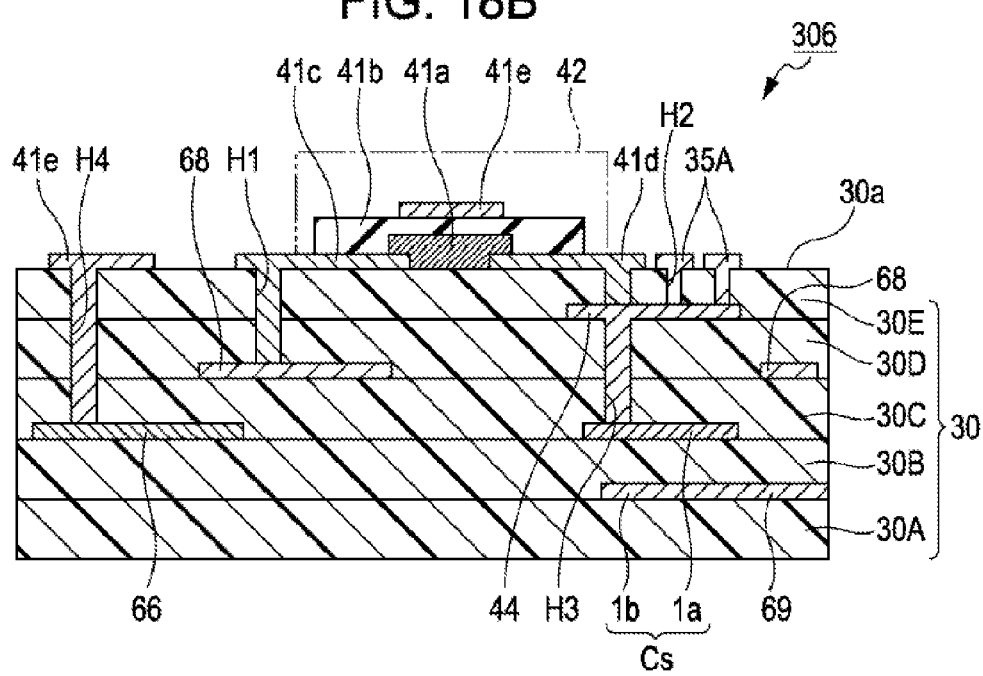
FIG. 18B is a cross-sectional view taken along line XVIIIB-XVIIIB shown in FIG. 18A.

FIG. 18A is a plan view schematically showing the configuration of one pixel on the component substrate according to the seventh embodiment, and FIG. 18B is a cross-sectional view taken along line XVIIIB-XVIIIB shown in FIG. 18A.

In the previous embodiment, although one pixel electrode 35 is disposed within one pixel, on the component substrate 306 according to this embodiment, a plurality of pixel electrodes (first electrodes) 35A is disposed within one pixel, which is different from the previous embodiment.

As shown in FIGS. 18A and 18B, on the surface 30a of the first substrate 30, a plurality of island-shaped pixel electrodes 35A representing a circular shape in the plan view is arranged for each pixel 40. The pixel electrodes 35A are formed in the same process as that of a source electrode 41c and a drain electrode 41d of a control transistor TRc. The plurality of pixel electrodes 35A is connected to a connection electrode 44 disposed on the lower-layer side through a contact hole H2. The connection electrode 44 represents a comb-teeth shape and is formed so as to include a stem portion 441 extending along a scanning line 66 and a plurality of branch portions 442 connected by the stem portion 441. As above, the plurality of pixel electrodes 35A within one pixel is connected to each other by the connection electrode 44 and is simultaneously driven.

According to this embodiment, since the size of the display dot can be formed to be small, a bright and high precision display can be performed. The gray scale can be adjusted by the size of the dot, that is, the size of the pixel electrode 35A.

Eighth Embodiment

Next, the configuration of a component substrate according to an eighth embodiment will be described.

Figure 19A:
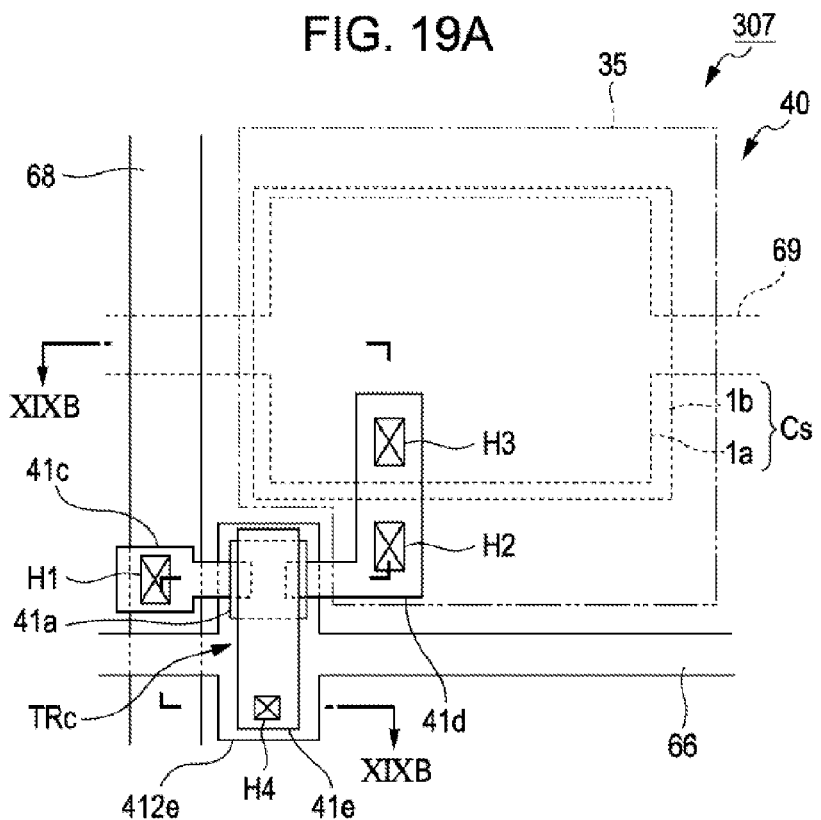
FIG. 19A is a plan view schematically showing the configuration of one pixel on a component substrate according to an eighth embodiment.
Figure 19B:
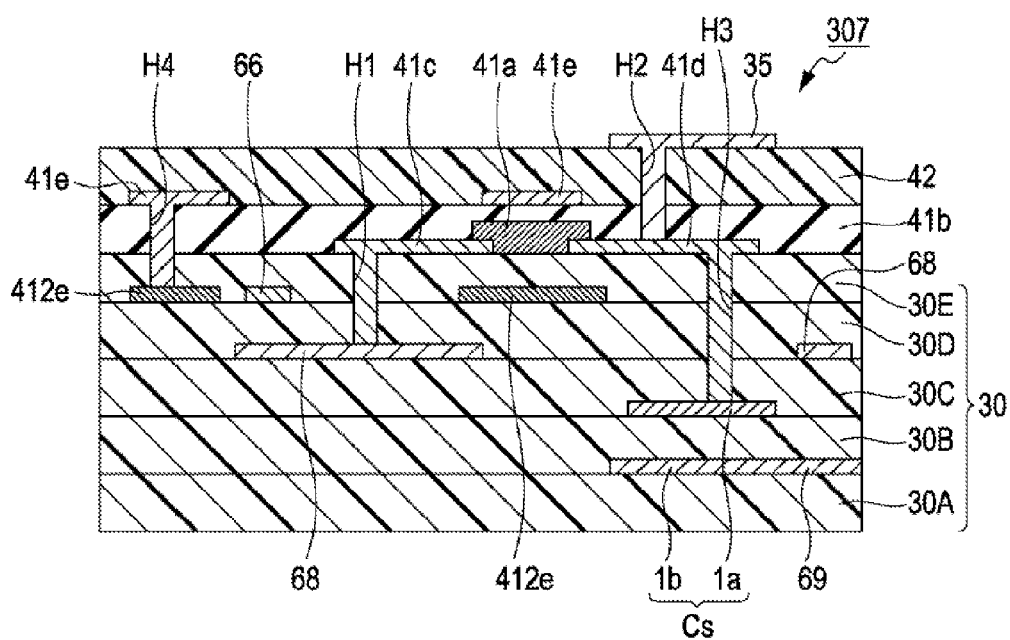
FIG. 19B is a cross-sectional view taken along line XIXB-XIXB shown in FIG. 19A.

FIG. 19A is a plan view schematically showing the configuration of one pixel on a component substrate according to the eighth embodiment, and FIG. 19B is a cross-sectional view taken along line XIXB-XIXB shown in FIG. 19A.

The component substrate 307 according to this embodiment has a double-gate structure in which the upper sides and the lower sides of at least parts of a source electrode 41c, a drain electrode 41d, and a semiconductor layer 41a are interposed between one pair of gate electrodes 41e and 412e.

The gate electrode 412e extends to both sides in the widthwise direction of the scanning line 66 and is formed at a position facing the gate electrode 41e arranged on a gate insulating film 41b. The gate electrodes 41e and 412e formed on different layers are connected to each other through a contact hole H4 that passes through the gate insulating film 41b and a base member 30E. The size of the gate electrode 412e in the plan view is larger than that of the gate electrode 41e. However, the invention is not limited thereto. In addition, it is preferable that a channel region is present inside the gate electrode 41e.

By configuring the structure of the control transistor TRc as the double-gate structure as in this embodiment, the high-frequency characteristics of the transistor can be improved.
TFT Structure Next, configuration examples of the control transistor will be described.

Figure 20A:
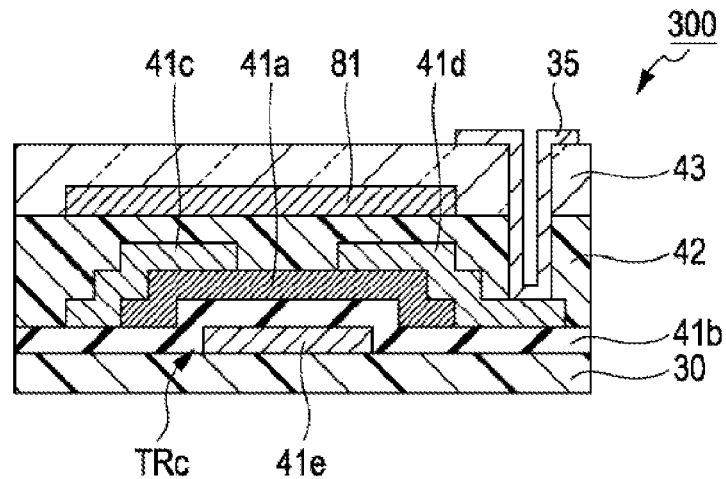
FIGS. 20A to 20C are cross-sectional views showing examples of the configuration of a control transistor.
Figure 20B:
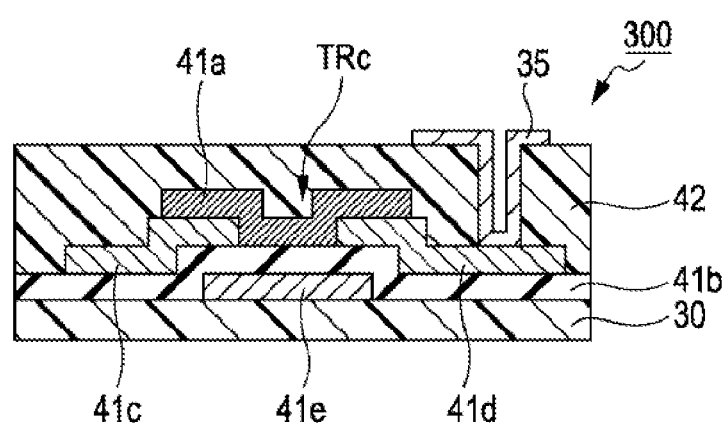
Figure 20C:
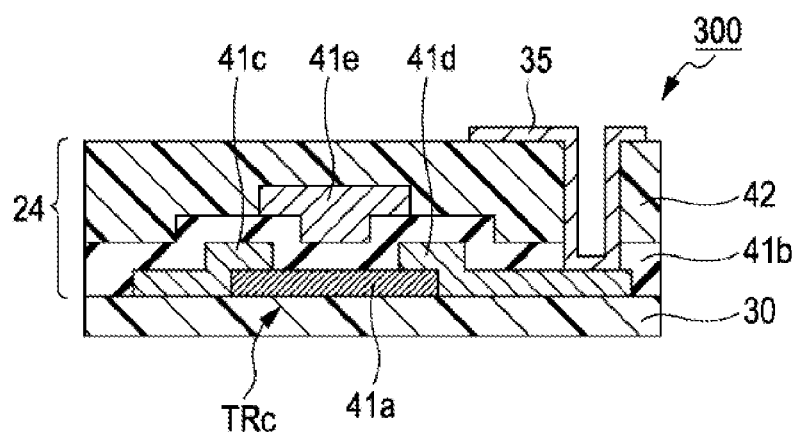

FIGS. 20A to 20C are cross-sectional views showing examples of the configuration of a control transistor. Although the first substrate 30 is represented as a single layer in FIGS. 20A and 20C, actually, the first substrate 30 has a multi-layer structure as described above.

The control transistor TRc having the bottom-gate and top-contact structure (BGTC) shown in FIG. 20A is configured by a gate electrode 41e, a gate insulating film 41b, a semiconductor layer 41a, a source electrode 41c, and a drain electrode 41d that are sequentially formed from the first substrate 30 side. Here, a protection layer 43 is further disposed on a protection layer 42 that covers the control transistor TRc, and a reflection electrode 81 that covers at least the semiconductor layer 41a of the control transistor TRc is disposed on the protection layer 42. The reflection electrode 81 is formed from an Al paste. A pixel electrode 35 is disposed on the surface of the transparent protection layer 43 that is formed from acryl.

As above, by arranging the reflection electrode 81 serving as a light shielding film on the control transistor TRc, the incidence of leakage light (external light) to the control transistor TRc (channel region) can be blocked. Accordingly, the effect of a light leakage current of the control transistor on an image is suppressed, whereby an improved image display can be performed.

The control transistor TRc having the bottom-gate and bottom-contact structure (BGBC) shown in FIG. 20B is configured by a gate electrode 41e, a gate insulating film 41b, a source electrode 41c, a drain electrode 41d, and a semiconductor layer 41a that are sequentially formed from the first substrate 30 side. A pixel electrode 35 is formed on a protection layer 42 that covers the control transistor TRc.

By using a substrate to which the gate electrode 41e is attached that is prepared as the first substrate 30, the control transistor TRc having the bottom-gate and top-contact structure or the control transistor TRc having the bottom-gate and bottom-contact structure can be generated.

The control transistor TRc having the top-gate and top-contact structure (TGTC) shown in FIG. 20C is configured by a semiconductor layer 41a, a source electrode 41c, a drain electrode 41d, a gate insulating film 41b, and a gate electrode 41e that are sequentially formed from the first substrate 30 side.

In addition, on a protection layer 42 that covers the control transistor TRc, a pixel electrode 35 is formed.

In FIGS. 20A to 20C, the layout or an equivalent circuit within one pixel is not limited to one TFT and one holding capacitor, and the pixel circuit may be configured by using a plurality of TFTs.

Next, a method of manufacturing a TFT will be described.

Here, in a case where at least one of the scanning line 66, the data line 68, and the holding capacitor Cs is buried inside the first substrate 30, a connection with the TFT is performed by using one of the above-described methods.

Next, the structure of a component substrate that includes a moisture-resistant layer will be described.

The electrophoretic material or the liquid crystal material used as the material of the control transistor TRc or the electro-optical material has electro-optical characteristics that change in accordance with the moisture. Thus, in order to solve such a problem, a component substrate having moisture-resistance is configured.

Figure 21:
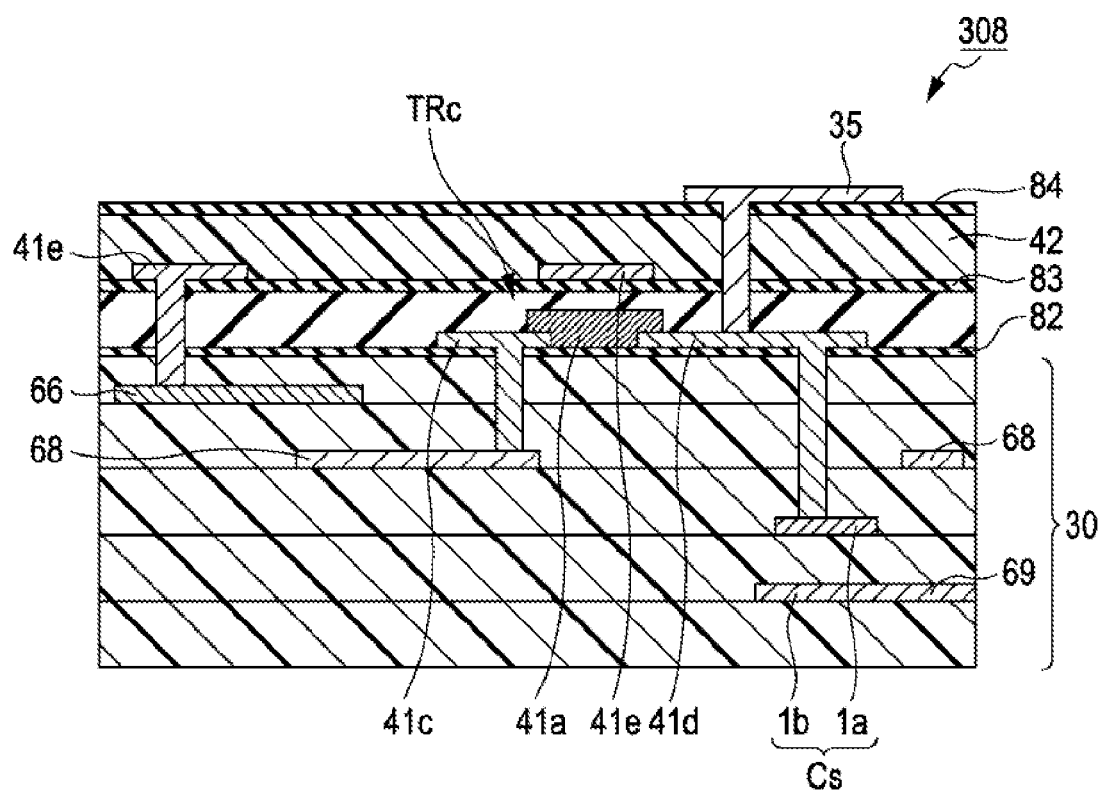
FIG. 21 is a partial cross-sectional view showing a schematic configuration of a component substrate that includes moisture-resistant layers.

FIG. 21 is a partial cross-sectional view showing a schematic configuration of the component substrate that includes moisture-resistant layers.

The component substrate 308 shown in FIG. 21 includes a plurality of (three) moisture-resistant layers 82, 83, and 84. Inside a first substrate 30, a holding capacitor Cs, a holding capacitor line 69, a scanning line 66, a data line 68 are buried. On the entire surface 30a of the first substrate 30, a moisture-resistant layer 82 is disposed. The source electrode 41c and the drain electrode 41d of a control transistor TRc and a semiconductor layer 41a are formed on the surface of the moisture-resistant layer 82. In addition, on the surface of the gate insulating film 41b that is formed on the moisture-resistant layer 82 so as to cover the source electrode 41c, the drain electrode 41d, and the semiconductor layer 41a, a moisture-resistant layer 83 is disposed as well. The gate electrode 41e is arranged on the moisture-resistant layer 83. In addition, on the surface of a protection layer 42 that covers the gate electrode 41e, a moisture-resistant layer 84 is disposed as well, and a pixel electrode 35 is arranged on the moisture-resistant layer 84.

The plurality of the moisture-resistant layers 82 to 84 are formed from a nitride silicon film having a thickness of 50 nm. However, the invention is not limited thereto. Thus, a silicon oxide film or an organic moisture-resistant layer may be used, as long as it can secure moisture resistance for the control transistor TRc and the electro-optical material.

In addition, a configuration having only one moisture-resistant layer or a configuration having three or more moisture-resistant layers may be employed.

Furthermore, the moisture-resistant layer may be disposed in any one of base members configuring the first substrate 30.

In FIG. 21, the first substrate 30 formed from a multi-layer substrate has been described. However, the first substrate 30 is not limited to the multi-layer structure as long as it can maintain the holding capacitor Cs, the holding capacitor line 69, the scanning line 66, the data line 68, and the like.

Next, examples will be described in which an embodiment of the invention is applied to devices other than the electro-optical device.

Figure 22A:
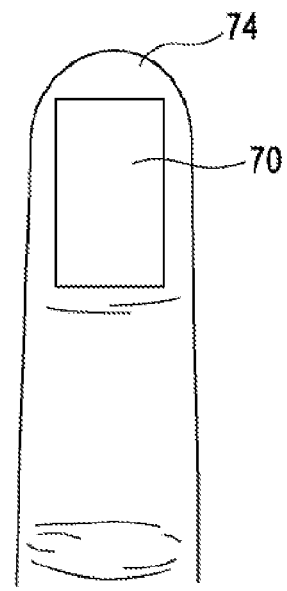
FIGS. 22A and 22B are diagrams showing an example in which a pressure-sensitive sensor is disposed at a fingertip of a robot.
Figure 22B:
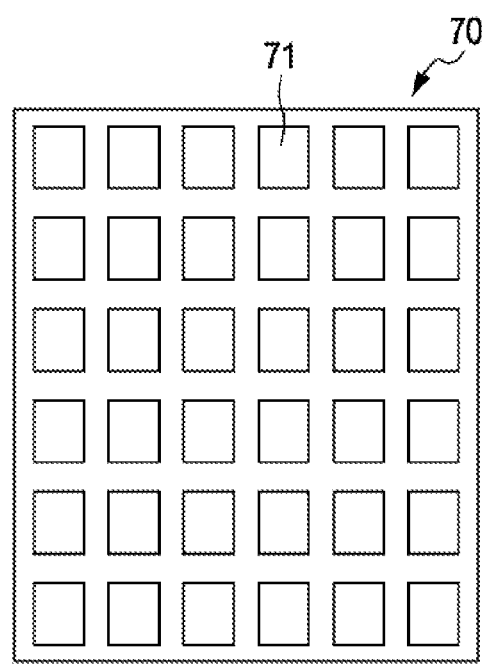
Figure 23:
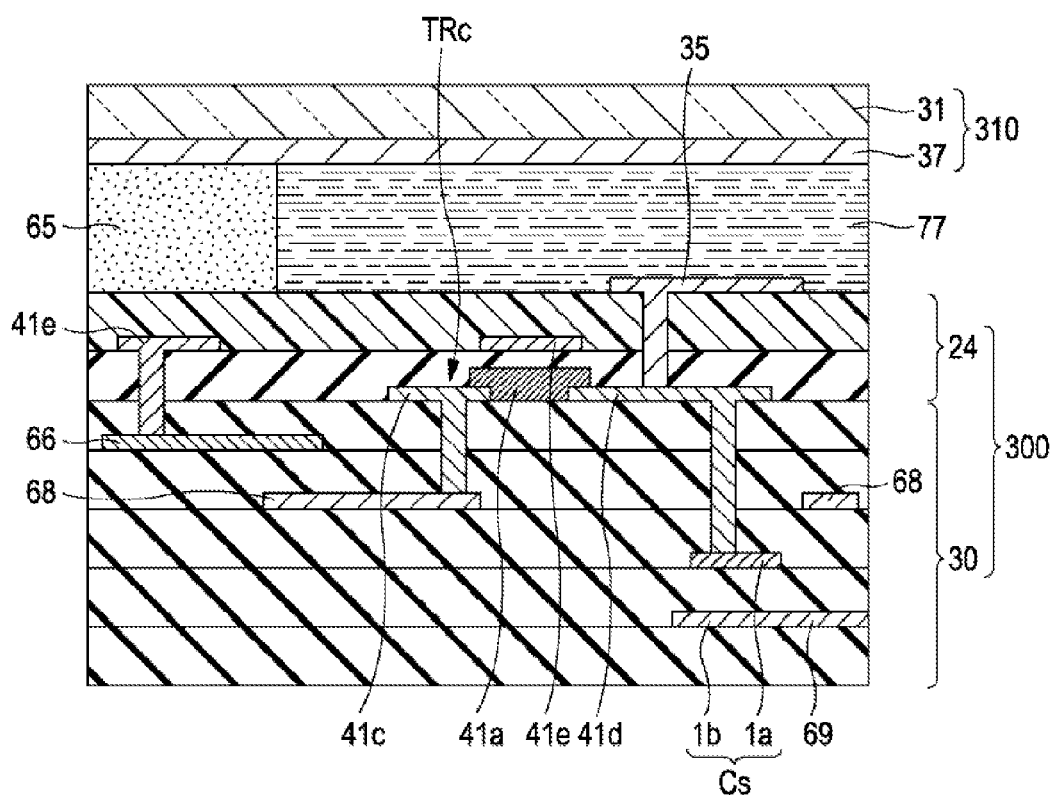
FIG. 23 is a cross-sectional view showing the configuration of the pressure-sensitive sensor.

FIGS. 22A, 22B, and FIG. 23 are examples in which a pressure-sensitive sensor is used as artificial skin of a robot. FIGS. 22A and 22B are diagrams showing an example in which a pressure-sensitive sensor is disposed at a fingertip of the robot. FIG. 23 is a cross-sectional view showing the configuration of the pressure-sensitive sensor.

As shown in FIGS. 22A, 22B, and 23, the pressure-sensitive sensor 70 (electric apparatus) disposed at the fingertip 74 of the robot is configured so as to include a plurality of detection elements 71 (corresponding to the pixels of the electro-optical device). The detection element 71 includes a component substrate 300 in which a scanning line 66, a data line 68, a holding capacitor Cs, and a holding capacitor line 69 are buried inside a first substrate 30. The component substrate is formed from one of the component substrates 300 to 308 according to the above-described embodiments. On the first substrate 30, a pixel electrode 35 and a control transistor TRc are disposed in a display area, and a scanning line driving circuit and a data line driving circuit, which are not shown in the figure, are disposed in a non-display area. On the other hand, an opposing substrate 310 is configured so as to include a second substrate 31 and an opposing electrode 37 that is formed from carbon nanotubes disposed on the surface (face opposing the piezoelectric layer 77) of the second substrate 31. Here, the second substrate 31 is formed from PET having a thickness of 0.2 mm.

In addition, between the component substrate 300 (301 to 308) and the opposing substrate 310, a piezoelectric layer 77 formed from a copolymer, which has a thickness of 1 μm, of trifluoroethylene and vinylidene fluoride is interposed. The copolymer of trifluoroethylene and vinylidene fluoride is an organic material and can be bent like the component substrate 300. In addition, between the peripheral edges of the component substrate 300 and the opposing substrate 310, a sealing member 65 that is partitioned and formed so as to surround the piezoelectric layer 77 is arranged.

In the pressure-sensitive sensor 70 that is formed by including a plurality of the detection elements 71, a voltage is generated between the opposing electrode 37 and the pixel electrode 35 when external pressure is applied to each detection element 71, and, by detecting a change in the voltage, it is determined whether or not an object is brought into contact with the fingertip 74 of the robot.

In addition, the piezoelectric material, the opposing electrode 37, and the protection layer 38 are not limited to those described above, and other organic materials and inorganic materials can be used. When a pyroelectric material is used instead of the piezoelectric material, a two-dimensional temperature sensor can be configured. In addition, when a photoelectric conversion material is used instead of the piezoelectric material, a two-dimensional optical sensor, a terahertz wave sensor, or an X-ray sensor can be configured. In addition, a configuration may be employed in which a change in the current value is detected. Furthermore, an embodiment of the invention can be applied to other electric apparatuses.

When these are used in a sensor or the like, in a case where there is a variation of the characteristics of the control transistors TRc, such a variation appears in the sensing result. For example, in the case of an optical sensor, not a uniform output but a textured output screen is formed. According to an embodiment of the invention, since the source electrode 41c, the drain electrode 41d, and the like of the first substrate 30 are formed through photo-etching, and the variation of the characteristics of the control transistors TRc is small. Accordingly, a uniform output image can be acquired.

In addition, in this embodiment, by using materials such as rubber that have stretchability as the materials of the first substrate 30 and the second substrate 31, the stretchability can be provided. In such a case, when the pressure-sensitive sensors shown in FIGS. 22A and 22B are attached to a complex curved face, the press-sensitive sensors can be uniformly attached. In addition, since the substrates have stretchability or elasticity, a feeling like humane skin can be realized.

The above-described embodiment of the invention can be applied to an electric apparatus other than a sensor.

Although the preferred embodiments of the invention have been described with reference to the accompanying drawings, it is apparent that the invention is not limited to the related examples. Thus, it is apparent that those skilled in the art can achieve various changed examples or modified examples within the scope of the technical concept written in the claims, and it is naturally understood that these belong to the technical scope of the invention.

In the above-described embodiments, although there is an example in which a capsule-type electrophoretic material is used, an embodiment of the invention is not limited thereto. Thus, an electrophoretic material such as a partition type in which partitions are included may be used, or an electrophoretic material in which partitions are not included may be used. In addition, a particle configuration other than a particle configuration having two types of black and white particles charged with opposite polarities may be used.

Furthermore, the electro-optical material that can be used is not limited to the electrophoretic material or the liquid crystal material. For example, an EL material, an electrowetting material, an MEMS material, or the like can be used.

The entire disclosure of Japanese Patent Application No. 2010-268713, filed Dec. 1, 2010 is expressly incorporated by reference herein.

What is claimed is:

1. A thin-film transistor forming substrate in which at least one of a source electrode, a drain electrode, and a gate electrode, which are constituent elements of a thin film transistor, or a first electrode is included on a face of a substrate main body that is located on any one side in a thickness direction, wherein an embedded wiring that is connected to one of the source electrode, the drain electrode, the gate electrode, and the first electrode is buried inside the substrate main body, wherein, the thin film transistor includes a semiconductor layer, and in the thin film transistor, at least parts of the semiconductor layer, the source electrode, and the drain electrode are pinched by one pair of the gate electrodes so as to form a double gate structure.

2. The thin-film transistor forming substrate according to claim 1, wherein the embedded wiring is one of a scanning line, a data line, a holding capacitor line, a holding capacitor, a signal line, and a power supply line.

3. The thin-film transistor forming substrate according to claim 2, wherein a line width of the embedded wiring is set to a size smaller than a size of a thickness of an insulating member arranged between the embedded wirings.

4. The thin-film transistor forming substrate according to claim 1,
wherein the substrate main body is formed by laminating a plurality of base members, and
wherein the embedded wiring is buried inside one of the plurality of base members, or a plurality of the embedded wirings is buried in the base members that are different from each other.

5. The thin-film transistor forming substrate according to claim 1, wherein the substrate main body has flexibility or stretchability.

6. The thin-film transistor forming substrate according to claim 1, wherein an electronic component is buried inside the substrate main body.

7. The thin-film transistor forming substrate according to claim 1, wherein an arrangement space of a plurality of the electronic components is equal to or greater than a length of one side of the electronic component and is preferably equal to or greater than three times a length of the one side.

8. The thin-film transistor forming substrate according to claim 1, wherein the electronic component is configured so as to include at least one or more types of an IC, a capacitor, a resistor, and an inductor.

9. The thin-film transistor forming substrate according to claim 1, wherein at least a part of one of the source electrode, the drain electrode, and the gate electrode or the first electrode is buried inside the substrate main body so as to be connected to the embedded wiring.

10. A semiconductor device comprising:
a substrate that is formed from the thin-film transistor forming substrate according to claim 1;
the thin film transistor that includes the semiconductor layer, the gate electrode, the drain electrode, and the source electrode that are configured so as to include a part of the constituent elements of the thin film transistor formed on the substrate;
the first electrode that is connected to the drain electrode; and
the embedded wiring that is embedded inside the substrate and connected to the thin film transistor.

11. The semiconductor device according to claim 10, wherein the source electrode, the drain electrode, and the first electrode are formed in a same layer.

* * * * *